(12) United States Patent
Ho et al.

(10) Patent No.: US 9,449,914 B2
(45) Date of Patent: Sep. 20, 2016

(54) STACKED INTEGRATED CIRCUITS WITH REDISTRIBUTION LINES

(71) Applicant: Taiwan Semiconductor Manufacturing Company, Ltd., Hsin-Chu (TW)

(72) Inventors: Cheng-Ying Ho, Minxiong Township (TW); Jeng-Shyan Lin, Tainan (TW); Wen-I Hsu, Tainan (TW); Feng-Chi Hung, Chu-Bei (TW); Dun-Nian Yaung, Taipei (TW); Ying-Ling Tsai, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/334,212

(22) Filed: Jul. 17, 2014

(65) Prior Publication Data

US 2016/0020170 A1    Jan. 21, 2016

(51) Int. Cl.
| | |
|---|---|
| *H01L 23/522* | (2006.01) |
| *H01L 21/768* | (2006.01) |
| *H01L 23/00* | (2006.01) |
| *H01L 25/00* | (2006.01) |

(52) U.S. Cl.
CPC ..... *H01L 23/5226* (2013.01); *H01L 21/76802* (2013.01); *H01L 21/76877* (2013.01); *H01L 24/24* (2013.01); *H01L 24/48* (2013.01); *H01L 24/82* (2013.01); *H01L 24/83* (2013.01); *H01L 25/50* (2013.01); *H01L 2224/24146* (2013.01); *H01L 2224/9202* (2013.01)

(58) Field of Classification Search
None
See application file for complete search history.

(56) References Cited

U.S. PATENT DOCUMENTS

| | | | |
|---|---|---|---|
| 4,956,312 | A | 9/1990 | Van Laarhoven |
| 6,111,319 | A | 8/2000 | Liou et al. |
| 6,207,494 | B1 | 3/2001 | Graimann et al. |
| 7,453,150 | B1 | 11/2008 | McDonald |
| 7,642,173 | B2 | 1/2010 | McDonald |
| 8,125,052 | B2 | 2/2012 | Jeng et al. |
| 8,153,521 | B2 | 4/2012 | Kang et al. |
| 8,158,515 | B2 | 4/2012 | Farooq et al. |
| 8,344,514 | B2 | 1/2013 | Cobbley et al. |
| 8,358,008 | B2 | 1/2013 | Wada et al. |

(Continued)

FOREIGN PATENT DOCUMENTS

| | | |
|---|---|---|
| JP | 2010114165 | 5/2010 |
| JP | 2013251511 | 12/2013 |
| KR | 20100094905 A | 8/2010 |

*Primary Examiner* — Matthew Reames
*Assistant Examiner* — Steven B Gauthier
(74) *Attorney, Agent, or Firm* — Slater Matsil, LLP

(57) ABSTRACT

An integrated circuit structure includes a first and a second semiconductor chip. The first semiconductor chip includes a first substrate and a first plurality of dielectric layers underlying the first substrate. The second semiconductor chip includes a second substrate and a second plurality of dielectric layers over the second substrate, wherein the first and the second plurality of dielectric layers are bonded to each other. A metal pad is in the second plurality of dielectric layers. A redistribution line is over the first substrate. A conductive plug is electrically coupled to the redistribution line. The conductive plug includes a first portion extending from a top surface of the first substrate to a bottom surface of the first substrate, and a second portion extending from the bottom surface of the first substrate to the metal pad. A bottom surface of the second portion contacts a top surface of the metal pad.

20 Claims, 21 Drawing Sheets

(56) References Cited

U.S. PATENT DOCUMENTS

| | | |
|---|---|---|
| 8,421,193 B2 | 4/2013 | Huang |
| 8,525,345 B2 | 9/2013 | Yen et al. |
| 8,592,991 B2 | 11/2013 | Lee et al. |
| 8,692,382 B2 | 4/2014 | Yen et al. |
| 9,006,804 B2 | 4/2015 | Hung et al. |
| 9,059,696 B1 | 6/2015 | Rahman |
| 2002/0123219 A1 | 9/2002 | Laverty et al. |
| 2006/0073695 A1 | 4/2006 | Filippi et al. |
| 2009/0014843 A1 | 1/2009 | Kawashita et al. |
| 2009/0134432 A1 | 5/2009 | Tabata et al. |
| 2010/0090317 A1 | 4/2010 | Zimmermann et al. |
| 2010/0171196 A1 | 7/2010 | Steadman et al. |
| 2010/0224876 A1 | 9/2010 | Zhu |
| 2010/0238331 A1* | 9/2010 | Umebayashi ..... H01L 27/14632 348/294 |
| 2011/0062501 A1 | 3/2011 | Soss et al. |
| 2011/0133339 A1 | 6/2011 | Wang |
| 2011/0171582 A1 | 7/2011 | Farooq et al. |
| 2011/0171827 A1 | 7/2011 | Farooq et al. |
| 2012/0038020 A1 | 2/2012 | Lin et al. |
| 2012/0038028 A1 | 2/2012 | Yaung et al. |
| 2012/0056330 A1 | 3/2012 | Lee et al. |
| 2012/0181698 A1 | 7/2012 | Xie et al. |
| 2012/0193785 A1* | 8/2012 | Lin ................... H01L 21/76229 257/737 |
| 2013/0093098 A1 | 4/2013 | Yang et al. |
| 2013/0140680 A1 | 6/2013 | Harada et al. |
| 2013/0264688 A1 | 10/2013 | Qian et al. |
| 2014/0070426 A1 | 3/2014 | Park et al. |
| 2014/0175653 A1 | 6/2014 | Sandhu et al. |
| 2014/0247380 A1 | 9/2014 | Hynecek |
| 2014/0264709 A1 | 9/2014 | Tsai et al. |
| 2014/0264862 A1 | 9/2014 | Tsai et al. |
| 2014/0264947 A1 | 9/2014 | Lin et al. |
| 2014/0361352 A1 | 12/2014 | Hung et al. |
| 2015/0129942 A1 | 5/2015 | Kao |
| 2015/0221695 A1 | 8/2015 | Park et al. |
| 2015/0243582 A1 | 8/2015 | Klewer |

* cited by examiner

STACKED INTEGRATED CIRCUITS WITH REDISTRIBUTION LINES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g. shrinking the semiconductor process node towards the sub-20 nm node), which allows more components to be integrated into a given area. As the demand for miniaturization, higher speed, and greater bandwidth, as well as lower power consumption and latency, has grown recently, the need for smaller and more creative packaging techniques of semiconductor dies has grown.

As semiconductor technologies further advance, stacked semiconductor devices have emerged as an effective alternative to further reduce the physical size of a semiconductor device. In a stacked semiconductor device, active circuits such as logic, memory, processor circuits, and the like are formed on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding, and/or the like. Once two semiconductor wafers are bonded together, the interface between two semiconductor wafers may provide an electrically conductive path between the stacked semiconductor wafers.

An advantageous feature of the stacked semiconductor devices is that much higher density can be achieved by employing stacked semiconductor devices. Furthermore, stacked semiconductor devices can achieve smaller form factors, cost-effectiveness, increased performance, and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
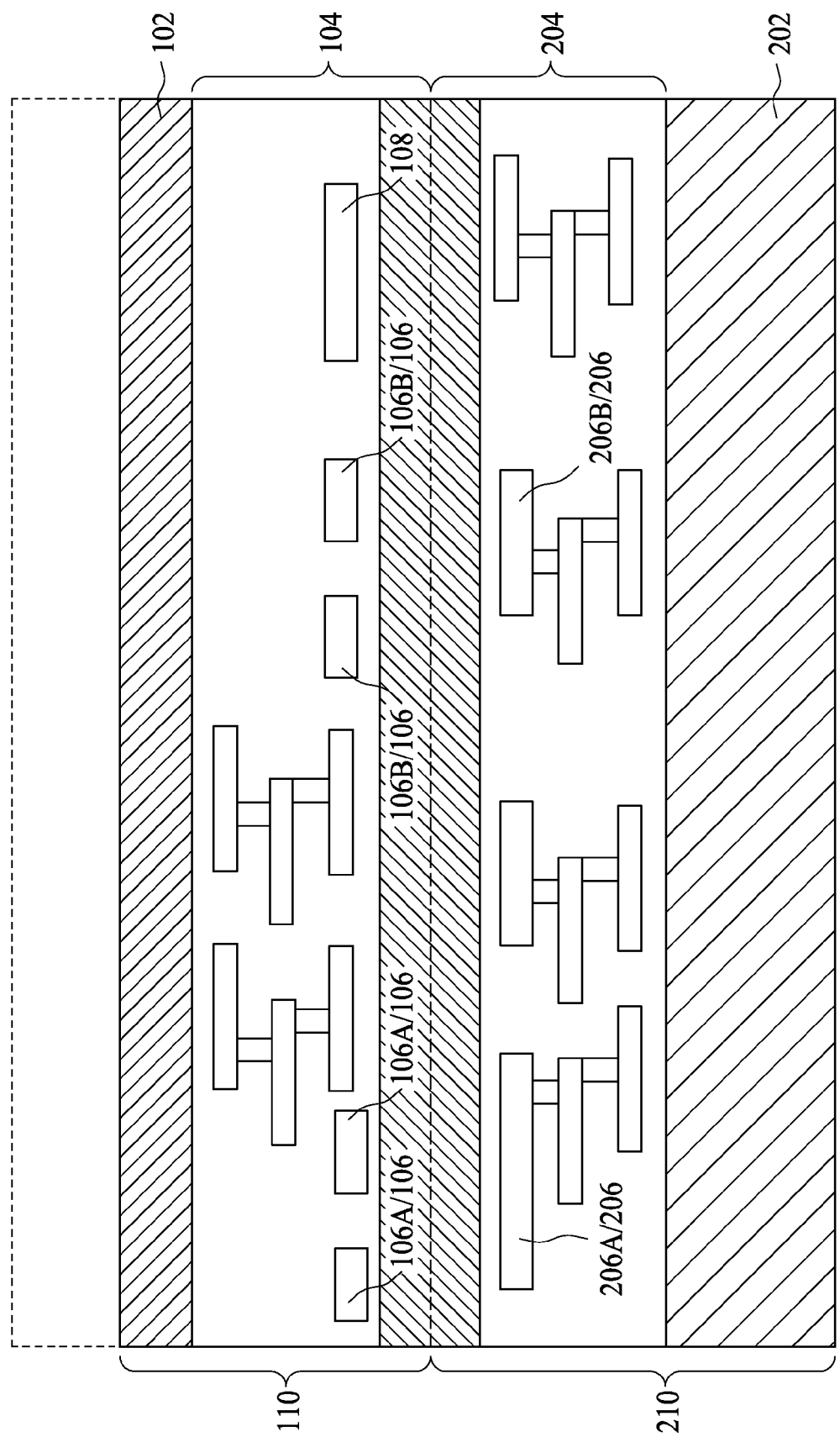
FIGS. 1 through 7 illustrate the cross-sectional views of intermediate stages in the formation of a package including stacked dies and including an interconnect structure connecting two chips in accordance with some exemplary embodiments, wherein a metal hard mask is used.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including stacked dies/chips and an interconnect structure interconnecting the stacked chips as well as the method of forming the same structure are provided in accordance with various exemplary embodiments. The intermediate stages of forming the interconnect structure are illustrated. The variations of the embodiments are discussed. Throughout the various views and illustrative embodiments, like reference numbers are used to designate like elements.

FIGS. 1 through 7 illustrates the cross-sectional views of intermediate stages in the bonding and the formation of Redistribution Lines in accordance with some embodiments. FIG. 1 illustrates a cross-sectional view of wafer 110 and 210 bonded to each other in accordance with some embodiments of the present disclosure. Both the first semiconductor wafer 110 and the second semiconductor wafer 210 include a semiconductor substrate (e.g. first substrate 102 and second substrate 202) and a plurality of interconnect structures (e.g. metal pads 106A, 106B, 108, 206A, 206B, and 208) formed over the semiconductor substrate.

As shown in FIG. 1, the first semiconductor wafer 110 may include a first substrate 102 and a plurality of inter-metal dielectric layers 104 lying under the first substrate 102. In addition, a plurality of metal lines (schematically illustrated) is formed in each of the dielectric layers 104, with metal vias and conductive plugs (not shown) interconnecting the plurality of metal lines. In accordance with some embodiments, metal pads 106 (including 106A and 106B)

are formed in the inter-metal dielectric layers 104. Although FIG. 1 illustrates that metal pads 106 are formed in an intermediate layer of dielectric layers 104, metal pads 106 may be in any of dielectric layers 104. Metal pad 108 is also formed in dielectric layers 104. In accordance with some embodiments, metal pads 106 (including 106A and 106B) and 108 are formed in a same metal layer.

The first substrate 102 may be formed of silicon, although it may also be formed of other group III, group IV, and/or group V elements such as silicon, germanium, gallium, arsenic, or combinations thereof. In addition, other substrates that may be used include multi-layered substrates, gradient substrates, hybrid orientation substrates, or combinations thereof.

Figure 7:
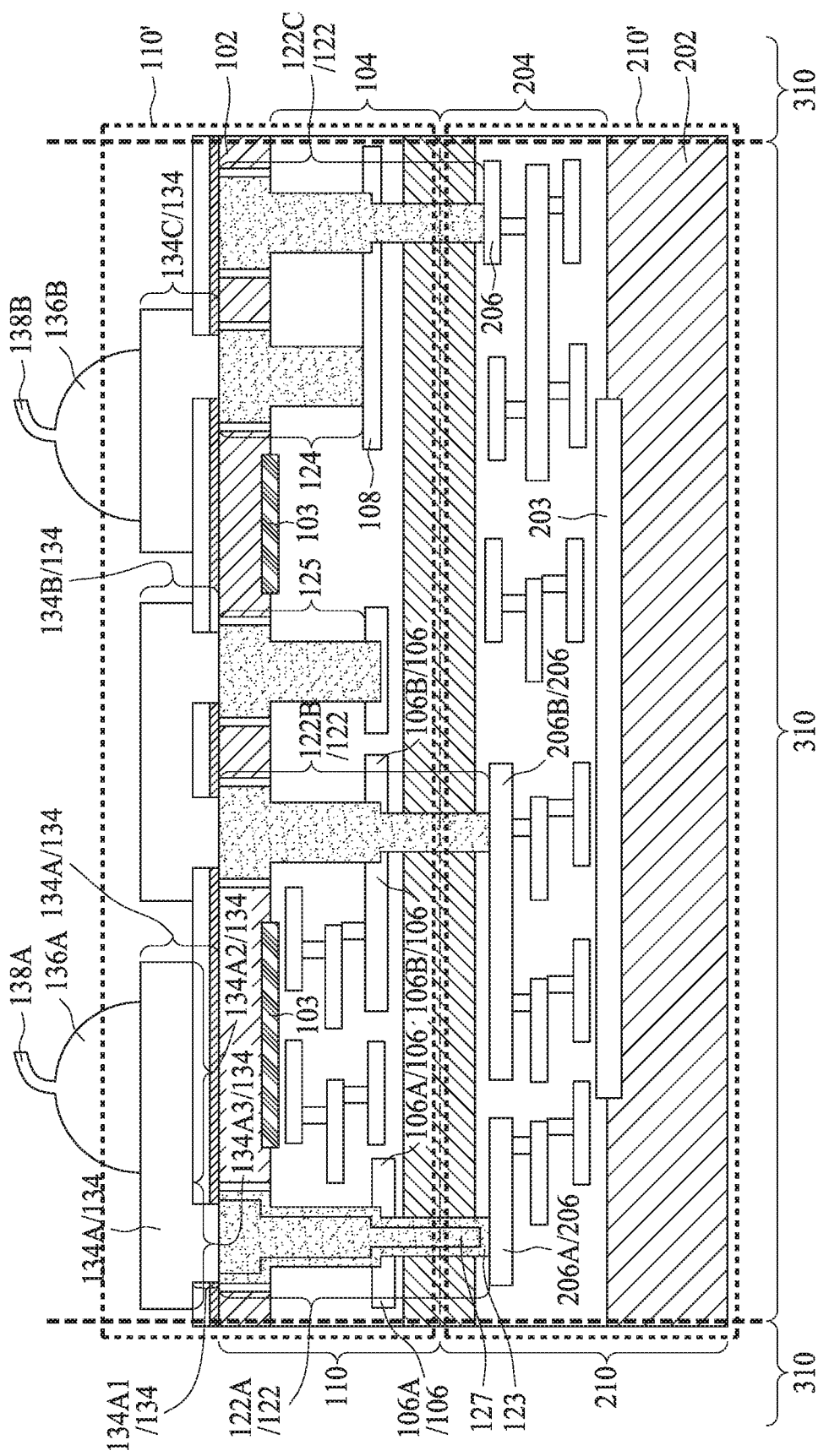

The first wafer 110 and second wafer 210 may further include a variety of electrical circuits 103 and 203 (shown in FIG. 7 as an example). The electrical circuits 103 formed on the first substrate 102 may be any type of circuitry suitable for a particular application. In accordance with some embodiments, the electrical circuits 103 may include various N-type Metal-Oxide Semiconductor (NMOS) and/or P-type Metal-Oxide Semiconductor (PMOS) devices, capacitors, resistors, diodes, photo-diodes, fuses, and/or the like.

Electrical circuits 103 may be interconnected to perform one or more functions. Electrical circuits 103 may include memory devices, processing structures, sensors, amplifiers, power distributors, input/output circuitry, and/or the like. One of ordinary skill in the art will appreciate that the above examples are provided for illustrative purposes and are not intended to limit the various embodiments to any particular applications.

Metal pads 106 may be made through any suitable formation process (e.g. lithography with etching, single damascene, dual damascene, or the like) and may be formed using suitable conductive materials such as copper, aluminum, aluminum alloys, copper alloys, or the like. FIGS. 20A through 20D illustrate some exemplary top views of metal pads 106, which show metal pads 106 forming rings with openings. Hence, the two illustrated portions (FIG. 1) of each of metal pads 106A and 106B are portions of an integrated metal pad.

As shown in FIG. 1, the first semiconductor wafer 110 is stacked on top of the second semiconductor wafer 210. Semiconductor wafer 210 may also include circuits 203 (shown in FIG. 7 as a example), which may have any of the devices as discussed for circuits 103. The first semiconductor wafer 110 and the second semiconductor wafer 210 are bonded together through suitable bonding techniques such as oxide-to-oxide bonding, for example. In accordance with some embodiments, in an oxide-to-oxide bonding process, the surface layers of semiconductor wafers 110 and 210 are oxide layers (for example, silicon oxide), which are bonded to each other through fusion bonding.

Figure 2:
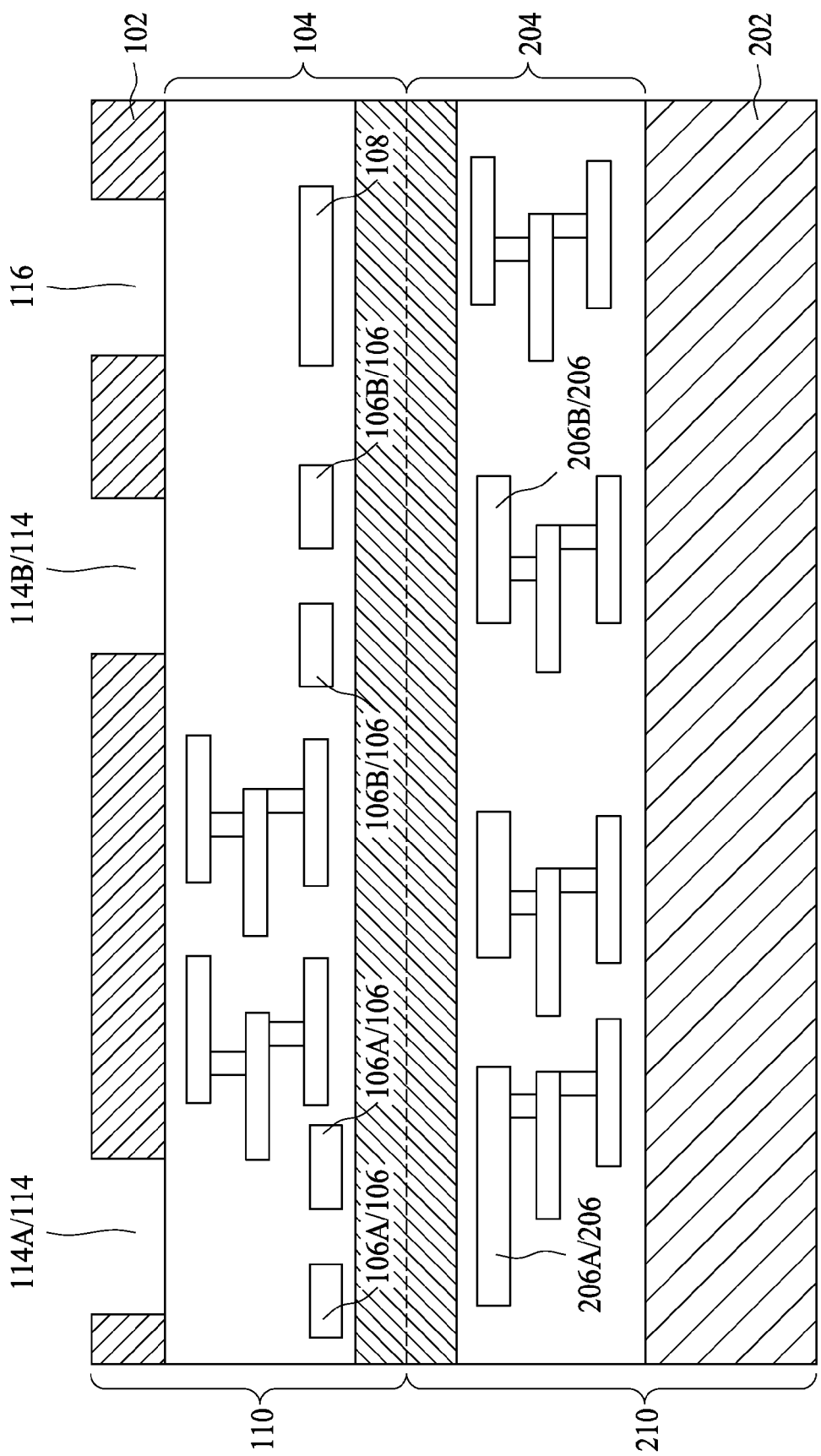

FIG. 2 illustrates a cross-sectional view of the semiconductor device shown in FIG. 1 after a thin-down and etching of first substrate 102. Throughout the description, the side of the first substrate 102 facing away from wafer 210 is referred to as the backside of the first substrate 102. The backside of first substrate 102 is grinded so that the back portion (illustrated using dashed lines in FIG. 1) of first substrate 102 is removed. The resulting substrate 102 may have a thickness smaller than about 5 μm.

After the thinning of substrate 102, a patterned mask such as a photo resist (not shown) may be formed over first substrate 102 using suitable deposition and photolithography techniques. A suitable etching process, such as a Reactive Ion Etch (RIE) or any other suitable anisotropic etch or patterning process, may be applied to the substrate 102 of first semiconductor wafer 110. As a result, a plurality of through-openings 114 (including 114A and 114B) and 116 are formed in the first substrate 102.

Figure 3:
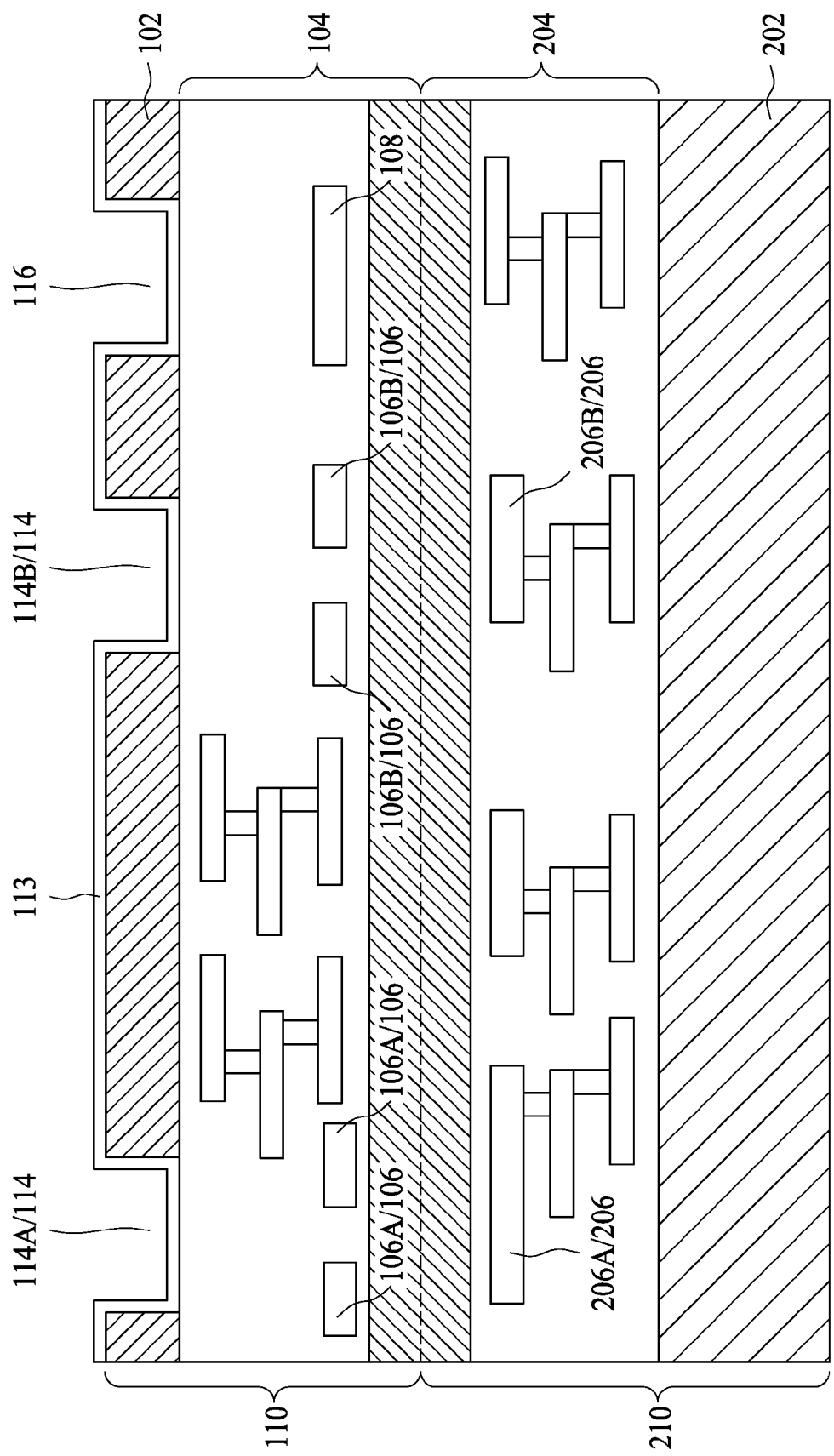

FIG. 3 illustrates a cross-sectional view of the semiconductor device shown in FIG. 2 after dielectric layer 113 is deposited over the semiconductor structure in accordance with various embodiments of the present disclosure. As shown in FIG. 3, dielectric layer 113 is formed on the bottoms and sidewalls of openings 114 and 116. Dielectric layer 113 is formed as a conformal layer whose horizontal portions and vertical portions have thicknesses close to each other.

Dielectric layer 113 may be formed from various dielectric materials that can be used in integrated circuit fabrication. For example, dielectric layer 113 may be formed from silicon dioxide, silicon nitride, silicon oxynitride, silicon carbide, or the like. In addition, a combination of the foregoing dielectric materials may also be used to form dielectric layer 113. In accordance with some embodiments, dielectric layer 113 is formed using a suitable technique such as a Chemical Vapor Deposition (CVD) method or Atomic Layer Deposition (ALD). The thickness of dielectric layer 113 may be in the range of about 1 kÅ to about 3 kÅ.

Figure 4:
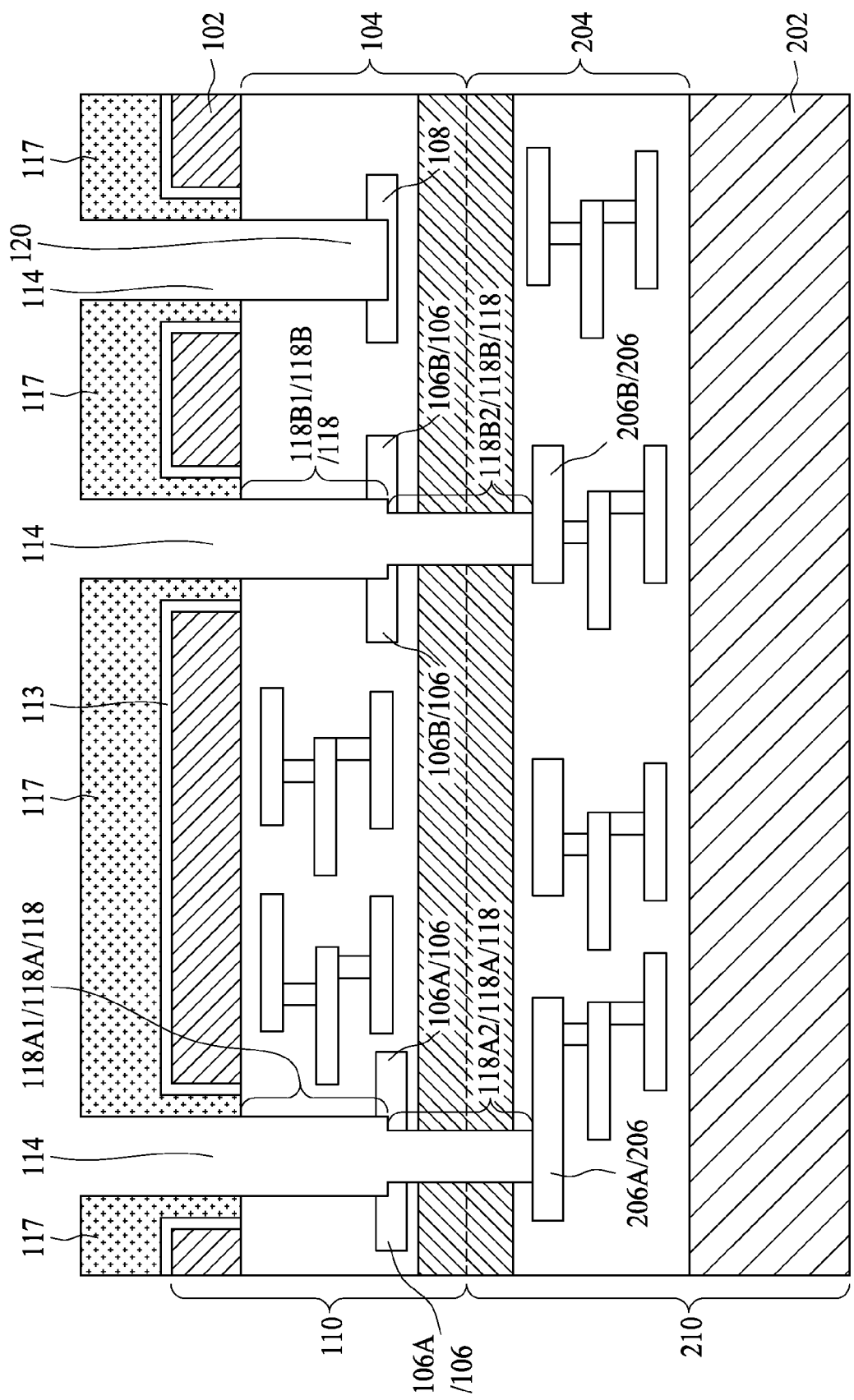

FIG. 4 illustrates a cross-sectional view of the semiconductor device shown in FIG. 3 after mask 117 layer is formed over the semiconductor device in accordance with various embodiments of the present disclosure. A patterned mask 117 is formed extending into openings 114 and 116 (shown in FIG. 3). As shown in FIG. 4, openings 118A (including 118A and 118B) and 120 are formed after the patterned mask 117 are formed along the sidewalls of the openings 114 and 116. The patterned mask 117 may be a photo resist layer.

FIG. 4 also illustrates a cross-sectional view of the semiconductor device after an etching process is applied to the semiconductor device in accordance with various embodiments of the present disclosure. A suitable etching process such as a dry etch is performed to form openings 118 and 120. Openings 118 and 120 are extensions of the respective overlying openings 114 and 116.

Openings 118 may have top-view sizes equal to or slightly greater than the top-view sizes of the openings in the respective underlying metal pads 106. The formation of opening experiences two etching stages. In the first etching stage, the portions of dielectric layers 104 over metal pads 106 are etched, forming openings 118A1 and 118B1. In the meantime, opening 120 is also formed simultaneously. The first etching stage concludes when metal pads 106A, 106B, and 108 are exposed. The etchant gas is selected to have a very low etching rate for etching metal pads 106A, 106B, and 108. Accordingly, metal pads 106A, 106B, and 108 function as metal hard masks to stop the etch process. Although the etching rate is low, metal pads 106 and 108 may still be partially etched away, thereby forming recesses in the exposed portions of metal pads 106 and 108. In the etching of metal pad 106, the metal atoms in metal pad 106 may be sputtered to the sidewalls of dielectric layers 104. Hence, the depth of the recesses in metal pads 106 and 108 is controlled to be as small as possible to reduce the undesirable sputter of metal atoms onto the sidewalls of dielectric layers 104.

In the second etching stage, the exposed portions of metal pads 106 and 108 act as etch stop layers to stop the etching. Accordingly, the etching stops at metal pad 108. On the other hand, the etching continues through the openings in metal pads 106A and 106B, and the dielectric layers 104 and 204 aligned to the openings in metal pads 106A and 106B are etched. Openings 118A2 and 118B2 are thus formed to extend from wafer 110 into wafer 210. The etching is finished when metal pads 206 (including 206A and 206B) are exposed, which act as the etch stop layers of the second etching stage. After the etching, patterned mask 117 is removed.

Figure 5:
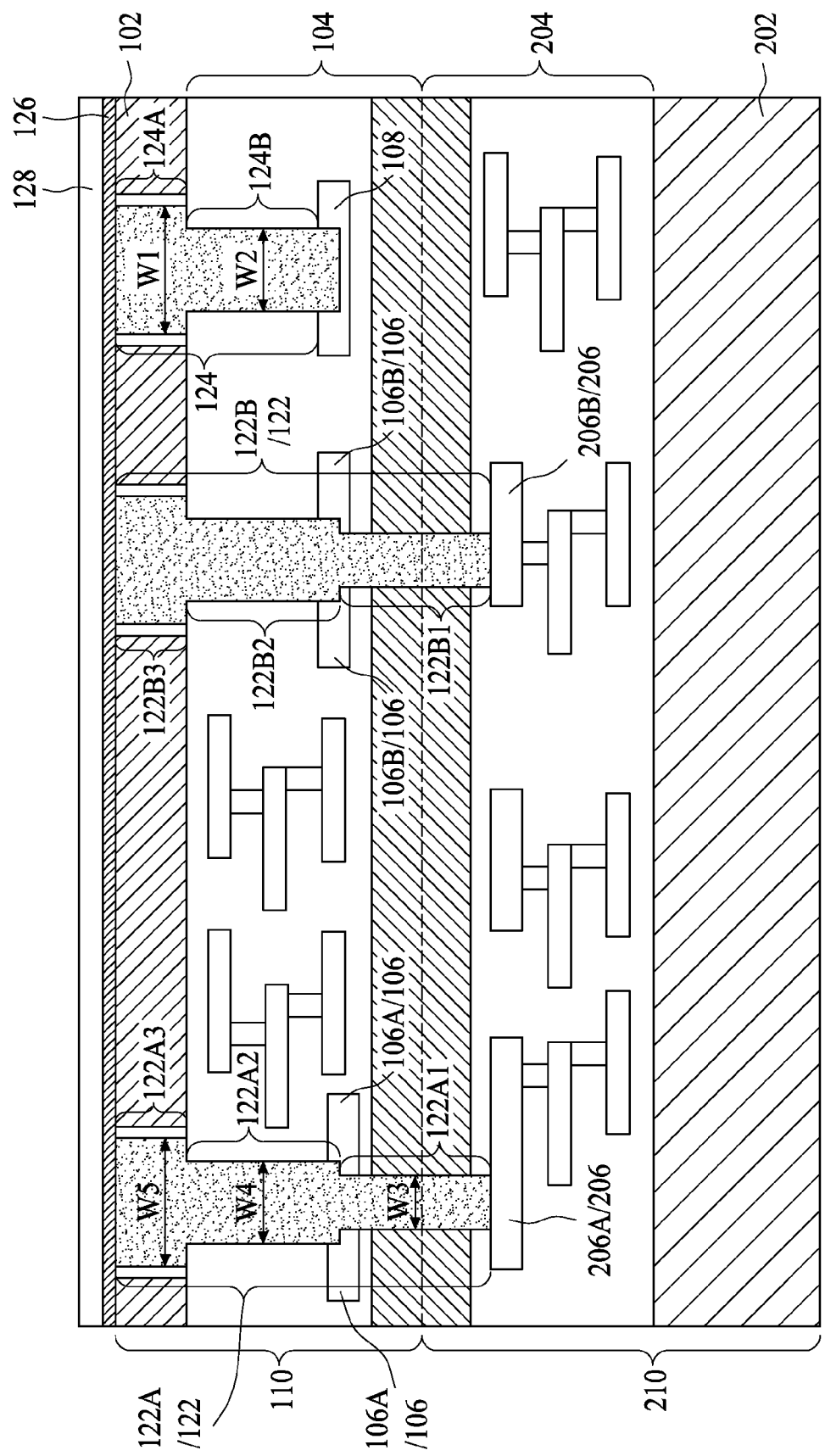

FIG. 5 illustrates a cross-sectional view after conductive materials have been filled in openings 114, 116, 118, and 120 in accordance with various embodiments of the present disclosure. As a result, conductive plugs 122 and 124 are formed. Conductive plugs 122 are alternatively referred to as through-vias hereinafter since they penetrate through wafer 110. In some embodiments, the formation of conductive plugs 122 and 124 includes forming a conformal conductive barrier layer 123. Conductive barrier 123 and the overlying filling metallic material 127 are schematically illustrated in conductive plug 122A in FIG. 7, although they are also included in all other conductive plugs 122, 124, and 125 (for example, FIGS. 6 and 7) in other embodiments. Barrier layer 123 may be formed from titanium, titanium nitride, tantalum, tantalum nitride, or combinations thereof. In some embodiments, conductive barrier layer 123 is a conformal layer with a substantially uniform thickness, which may be formed using suitable fabrication techniques such as ALD, Plasma Enhanced Chemical Vapor Deposition (PECVD), or the like.

In addition, a seed layer (not shown) may be deposited over the conductive barrier layer 123. The seed layer may be formed from copper, nickel, gold, any combination thereof and/or the like. The seed layer may be formed through suitable deposition techniques such as PVD, CVD, and/or the like.

Once barrier layer 123 and the seed layer have been deposited in the openings, a metallic material 127 is deposited to fill the rest of openings 114, 116, 118, and 120. The metallic material may include tungsten, titanium, aluminum, copper, or alloys thereof. In some embodiments, the openings of the metallic material may be filled in through an electroplating process. After the filling of the metallic material, a planarization such as Chemical Mechanical Polish (CMP) is performed to remove the excess portions of the metallic material. Metallic material 127 (and the conductive barrier layer 123) continuously extends from the top surface of substrate 102 into dielectric layers 204, with no interface formed therein since each of conductive barrier layer 123 and metallic material 127, which is formed of a homogeneous material, is formed in a single deposition step.

As shown in FIG. 5, conductive plug 124 includes portion 124A in first substrate 102, and portion 124B in dielectric layers 104. Portion 124A has width W1 greater than width W2 of portion 124B. Conductive plug 124 stops on metal pad 108.

As also shown in FIG. 5, each of conductive plugs 122A and 122B comprises three portions. The first portion extends from metal pad 206 to metal pad 106. The first portion (122A1/122B1) has width W3 as shown in FIG. 5. The second portion is from metal pad 106 to the front side of the first substrate 102. The second portion (122A2/122B2) has width W4 as shown in FIG. 5. The third portion (122A3/122B3) extends from the front side of the first substrate 102 to the backside of the first substrate 102. The third portion has width W5 as shown in FIG. 5. The first portion, and possibly the second portion, may physically contact the inner sidewall of the respective metal pad 106. In some embodiments, width W4 is greater than or equal to width W3, and width W5 is greater than width W4. The three portions of each of conductive plugs 122A and 122B form a continuous via that penetrates through wafer 110, wherein no interface is formed between the three portions.

After the planarization, etch stop layer 126 and dielectric layer 128 are formed. Etch stop layer 126 may include silicon nitride, silicon oxynitride, silicon oxycarbide, silicon carbide, or the like. Dielectric layer 128 is formed of a material different from the material of etch stop layer 126, although the material for dielectric layer 128 may also be selected from the same candidate materials as etch stop layer 126. In some exemplary embodiments, etch stop layer 126 comprises silicon nitride, and dielectric layer 128 comprises silicon oxide. In accordance with some embodiments, the thickness of dielectric layer 128 is in the range between about 4 kÅ and about 12 kÅ.

Figure 6:
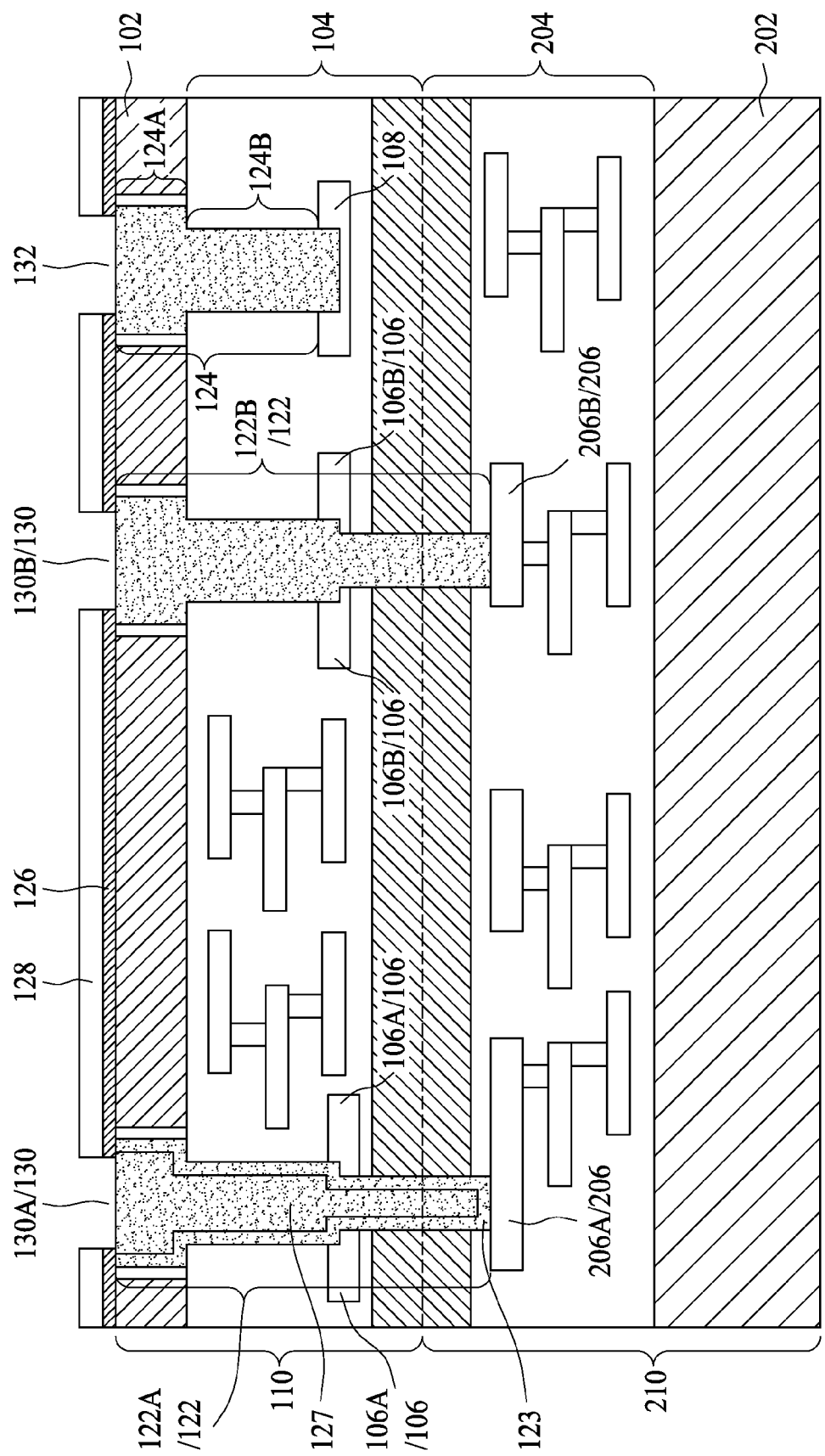

Referring to FIG. 6, dielectric layer 128 and etch stop layer 126 are patterned, forming openings 130 (including 130A and 130B) and 132. Conductive plugs 122 and 124 are exposed through openings 130 and 132, respectively.

Next, as shown in FIG. 7, RDLs 134 (including 134A, 134B, and 134C) are formed. It is appreciated that FIG. 7, in addition to the features shown in FIG. 6, also illustrate additional features such as conductive plugs 122C and 125, which are also formed simultaneously as the formation of conductive plugs 122A, 122B, and 124. In accordance with some embodiments, RDLs 134 are formed of metallic materials such as aluminum copper, alumina, copper, nickel, gold, tungsten, titanium, alloys thereof, or multi-layers thereof. The formation process may include depositing a seed layer such as a copper layer over the structure in FIG. 6, forming a patterned mask layer (such as photo resist, not shown) over the seed layer, plating the RDLs 134, removing the patterned mask layer, and removing the portions of the seed layer not covered by RDLs 134.

In a subsequent step, the bonded wafers 110 and 210 are sawed into a plurality of packages 310, each having the same structure as shown in FIG. 7. Package 310 includes chip 110' from wafer 110 and chip 210' from wafer 210, as illustrated. A wire bonding may be performed on RDL pad 134A2. The wire bond includes bond balls 136A and 136B and metal wires 138A and 138B connected to the respective bond balls 136A and 136B.

In accordance with the embodiments of the present disclosure, conductive plug 122A, 122B, and 122C interconnect the devices and metal lines in chips 110' and 210'. RDL 134A includes via 134A1 and extends into opening 130A (FIG. 6) and RDL pad 134A2. In addition, trace portion 134A3 may interconnect via 134A1 and RDL 134A2 and electrically couple the wire bond 136A to chips 110' and 210' through conductive plug 122A. RDL 134B is used as a routing line for the routing of the signals in chip 110'. For example, RDL 134B may be used to electrically route signals between conductive plugs 122B and 125. In some embodiments, no wire bonding or flip-chip bonding is performed on RDL 134B. RDL 134C is connected to wire bond ball 136B and metal wire 138B. RDL 134C is electrically connected to conductive plug 124, which stops at metal pad 108 and does not penetrate through chip 110'. Through metal pad 108, RDL 134C is further connected to conductive plug 122C, which further interconnects chip 110' and 210'. Hence, the formation of the RDLs 134A, 134B, and 134C improves the routing ability of electrical signals in package 310.

It should be noted that while FIG. 7 illustrates two semiconductor chips stacked together, one skilled in the art will recognize that the stacked semiconductor device shown in FIG. 7 is merely an example. There may be many alternatives, variations, and modifications. For example, the stacked semiconductor device may accommodate more than two semiconductor chips.

Figure 8:
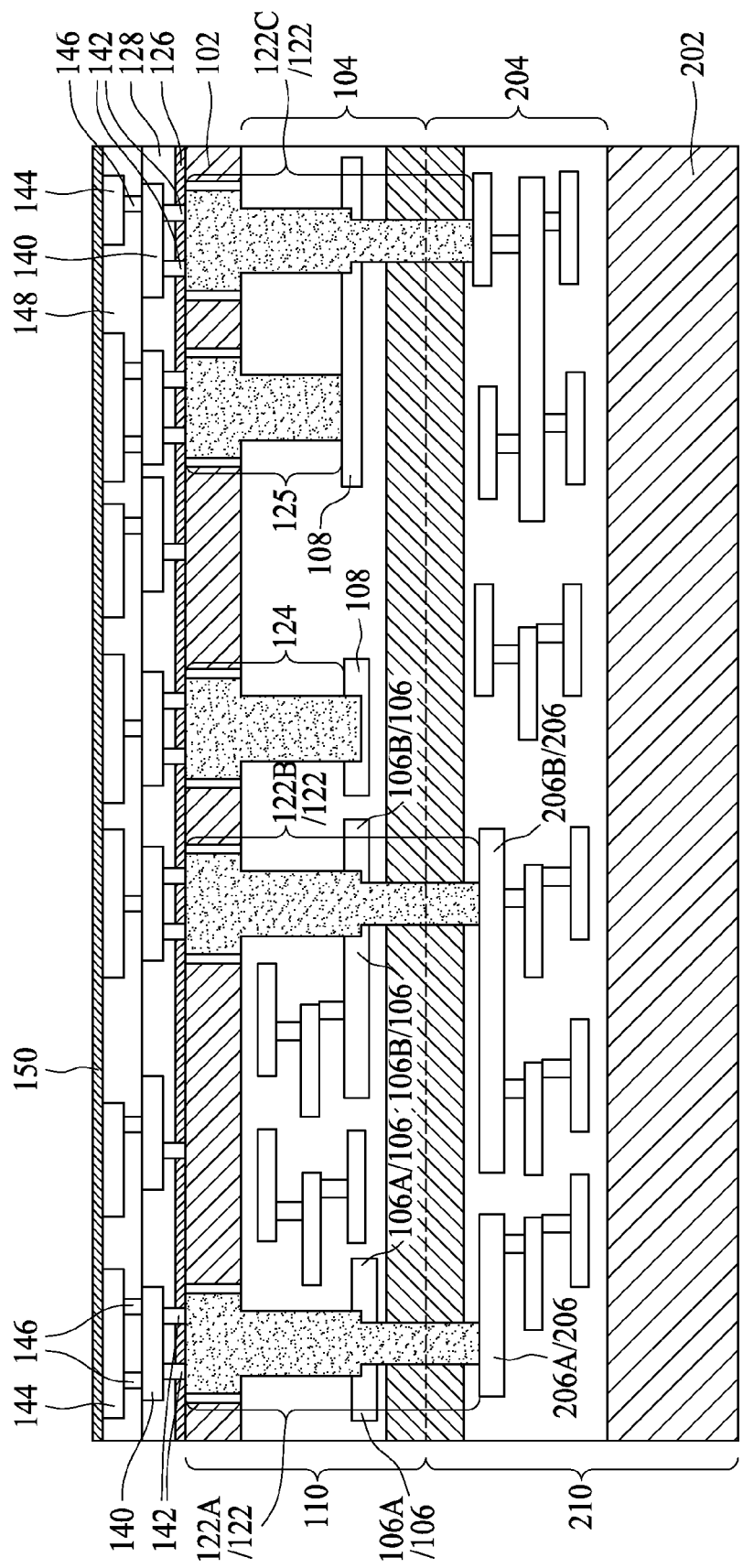
FIGS. 8 and 9 illustrate the cross-sectional views of intermediate stages in the formation of a package including stacked dies and including an interconnect structure connecting two chips in accordance with some other embodiments, wherein a metal hard mask is used.
Figure 9:
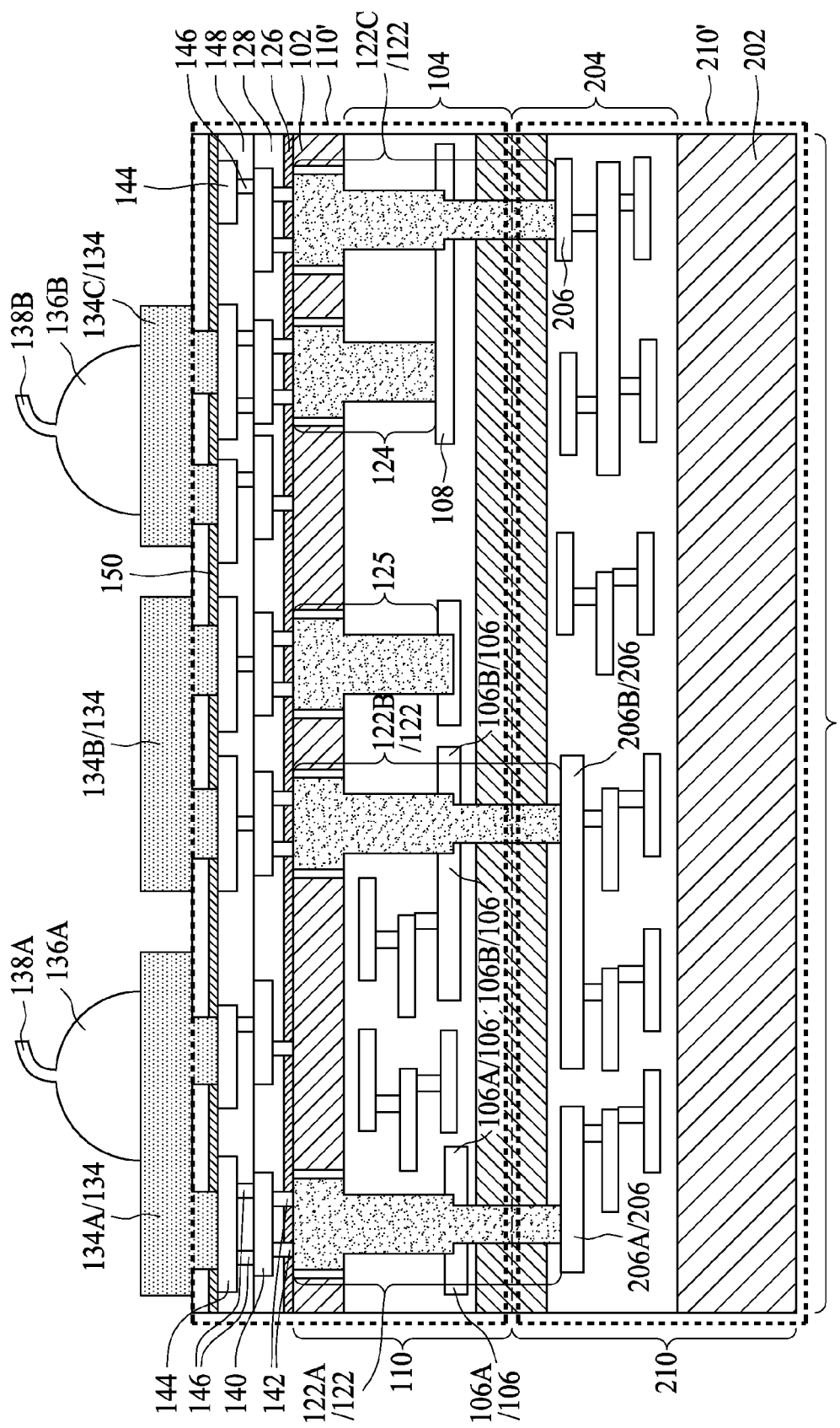

FIGS. 8 and 9 illustrate cross-sectional views of intermediate stages in the formation of stacked chips in accordance with alternative embodiments. Unless specified otherwise, the materials and the formation methods of the components in these embodiments are essentially the same as the like components, which are denoted by like reference numerals in the embodiments shown in FIGS. 1 through 7. The details regarding the formation process and the materials of the components shown in FIGS. 8 and 9 (and FIGS. 10 through 19) may thus be found in the discussion of the embodiment shown in FIGS. 1 through 7.

The initial steps of these embodiments are essentially the same as shown in FIGS. 1 through 5. Next, as shown in FIG. 8, metal lines 140 (which collectively form a metal layer) and vias 142 are formed in dielectric layer 128. Metal lines 140 and vias 142 may be formed using a dual damascene process, which includes forming trenches and via openings in dielectric layer 128 and etch stop layer 126 and filling the trenches and via openings with a metallic material to form metal lines 140 and vias 142, respectively. In alternative embodiments, single damascene processes may be used to form metal lines 140 and vias 142. More than one level of metal layer may be formed. For example, FIG. 8 illustrates that an additional metal layer including metal lines 144 and the respective vias 146 are formed in dielectric layer 148. Over metal lines 144, etch stop layer 150 is formed.

Referring to FIG. 9, RDLs 134A, 134B, and 134C and wire bonds 136A/138A and 136B/138B are formed. The formation process and the materials may be the same as in the embodiments shown in FIG. 7 and hence are not repeated herein. Similar to the embodiments shown in FIG. 7, RDLs 134A, 134B, and 134C are combined with conductive plugs 122A, 122B, 122C, 124, and 125 to route signals between chips 110' and 210' and to route signals within chip 110'.

FIGS. 10 through 17 illustrate the formation of stacked chips in accordance with alternative embodiments of the present disclosure. In these embodiments, the metal pads 106 as shown in FIGS. 7 and 9 are not formed. The brief formation process is discussed below.

Figure 10:
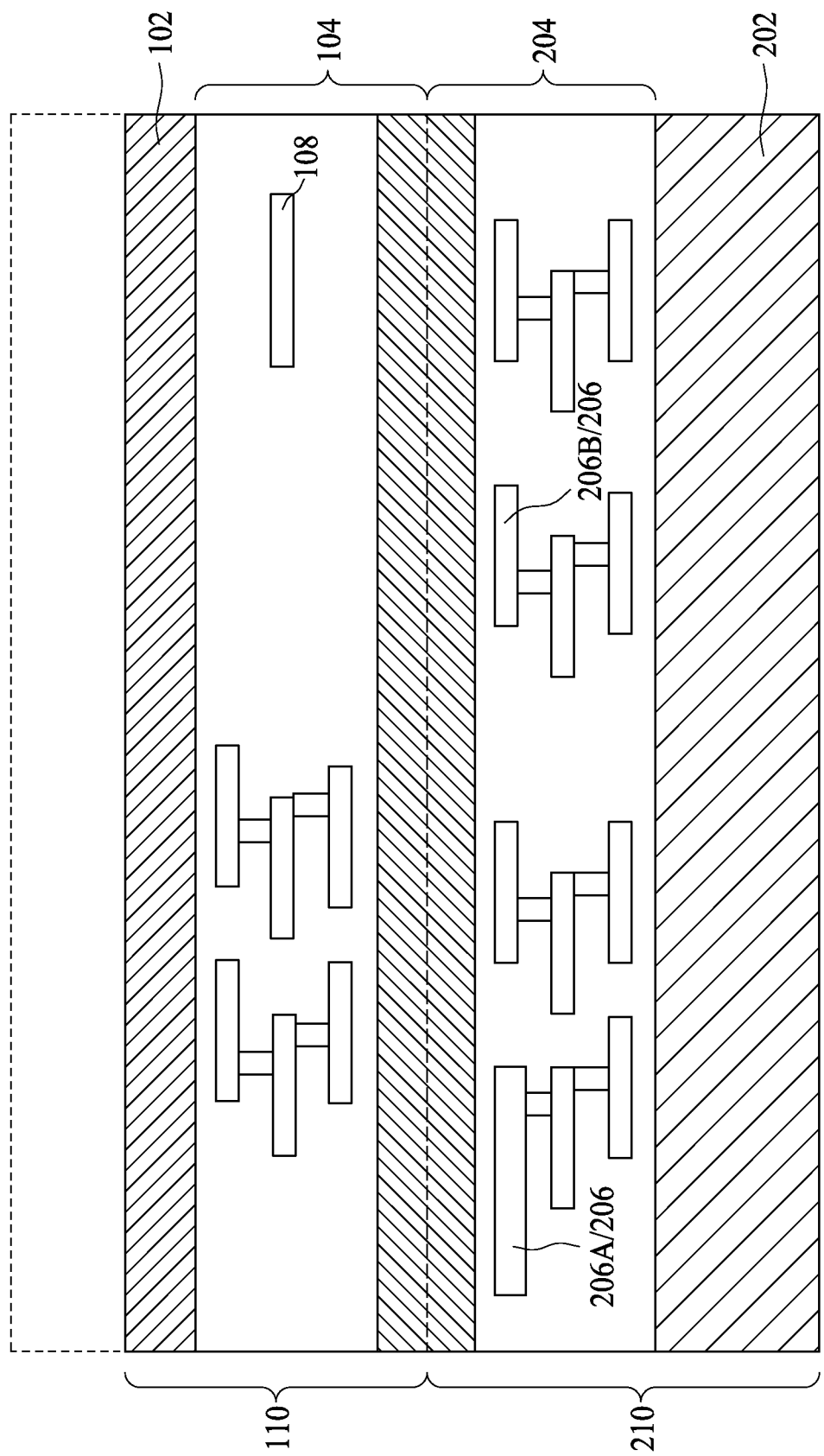
FIGS. 10 through 17 illustrate the cross-sectional views of intermediate stages in the formation of a package including stacked dies and including an interconnect structure connecting two chips in accordance with some exemplary embodiments, wherein a metal hard mask is not used.

Referring to FIG. 10, wafers 110 and 210 are bonded to each other, followed by the thinning of first substrate 102. The dashed lines schematically represent the portion of substrate 102 removed in the thinning. As shown in FIG. 10, metal pads 206 (including 206A and 206B) are formed in wafer 210. Different from the embodiments in FIG. 1, no metal pad is formed in wafer 110 to overlap metal pads 206. On the other hand, metal pad 108 is formed in dielectric layers 104 in wafer 110 at a location misaligned from metal pads 206.

Figure 11:
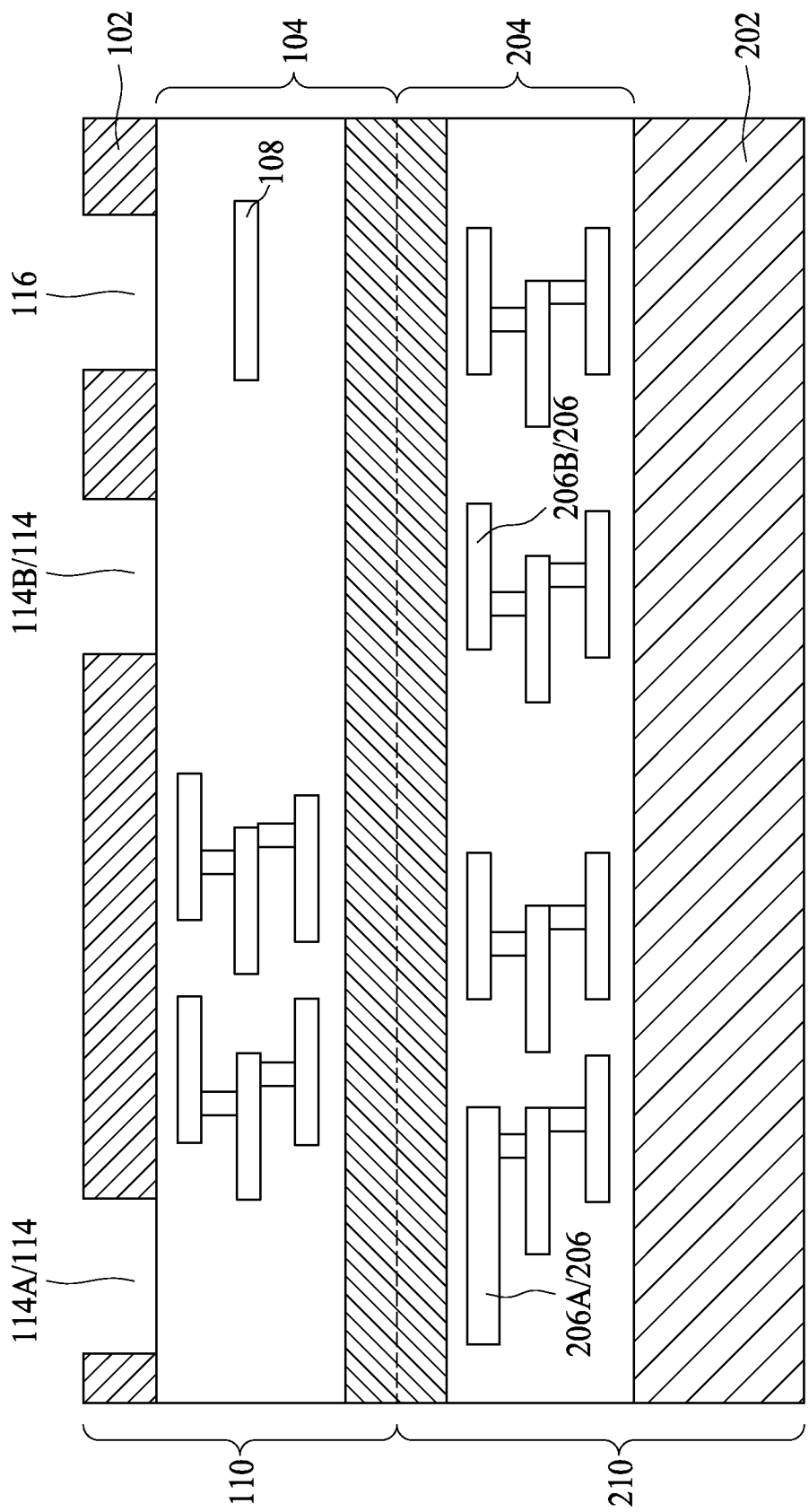
Figure 12:
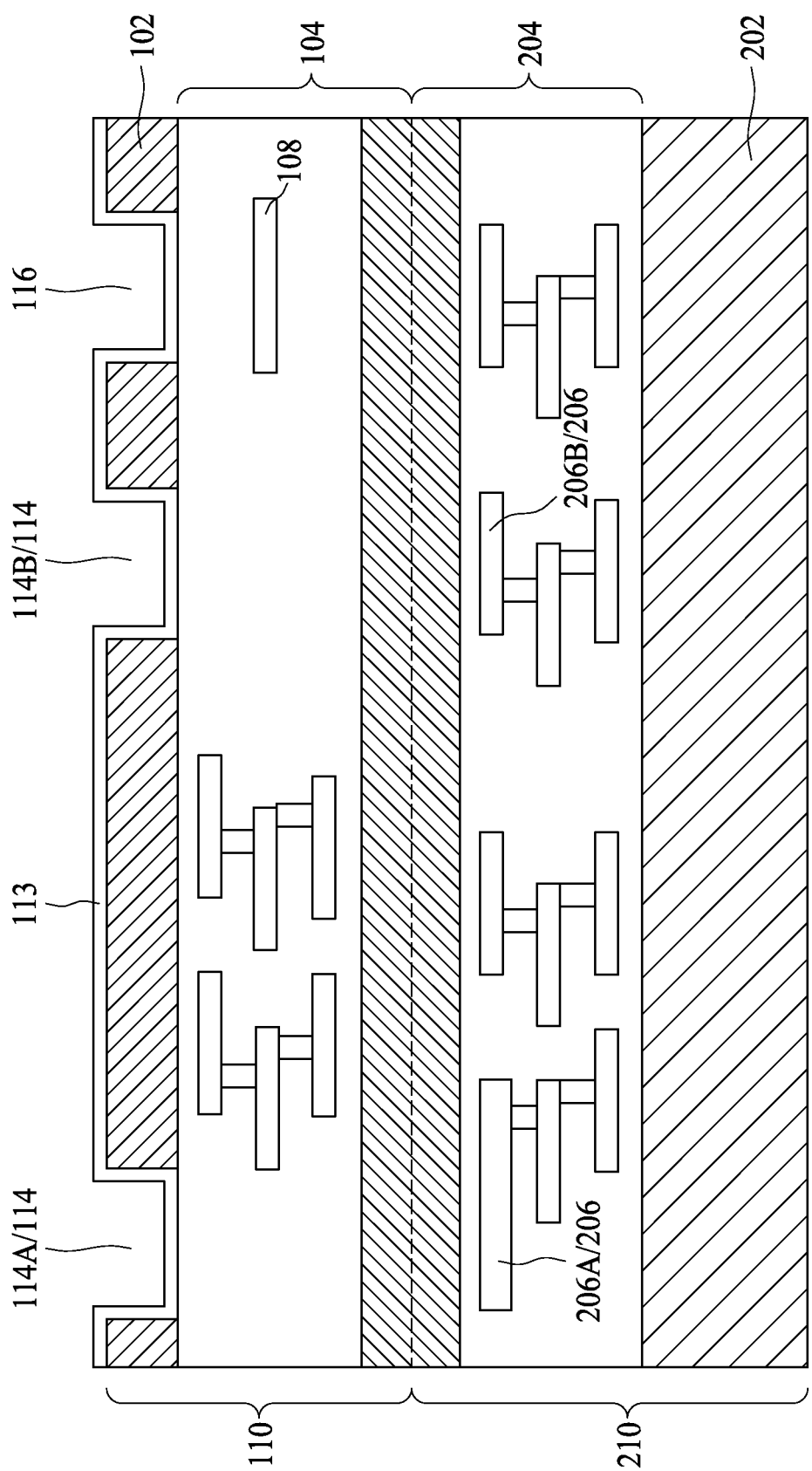

Referring to FIG. 11, openings 114 (including 114A and 114B) and 116 are formed by etching the thinned substrate 102, hence exposing the underlying dielectric layer 104. Next, as shown in FIG. 12, dielectric layer 113 is formed on the back surface and the sidewalls of substrate 102. Hence, the exposed surfaces of substrate 102 are insulated.

Figure 13:
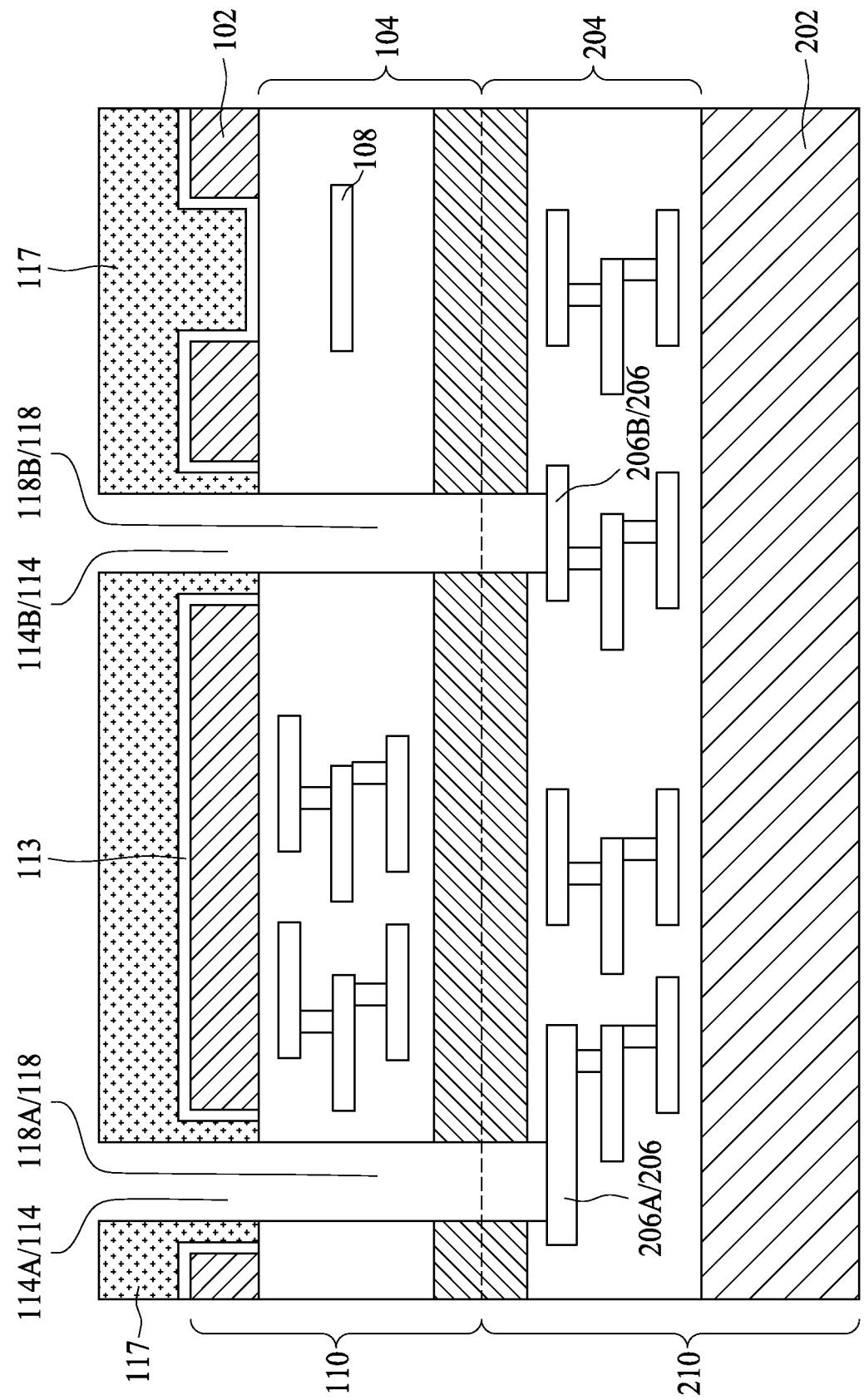

FIG. 13 illustrates the formation of mask layer 117, which masks opening 116 (FIG. 12), and leaving some portions of openings 114A and 114B exposed. An anisotropic etch step is then performed to etch dielectric layers 113, 104, and some portions of dielectric layer 204. The etching is performed until metal pads 206 are exposed. As shown in FIG. 13, since no metal hard masks (such as 106 in FIGS. 7 and 9) are formed, the resulting openings 118 (including 118A and 118B) extend all the way through dielectric layers 104 and into wafer 210. Openings 118A and 118B are stopped on metal pads 206. Mask layer 117 is then removed.

Figure 14:
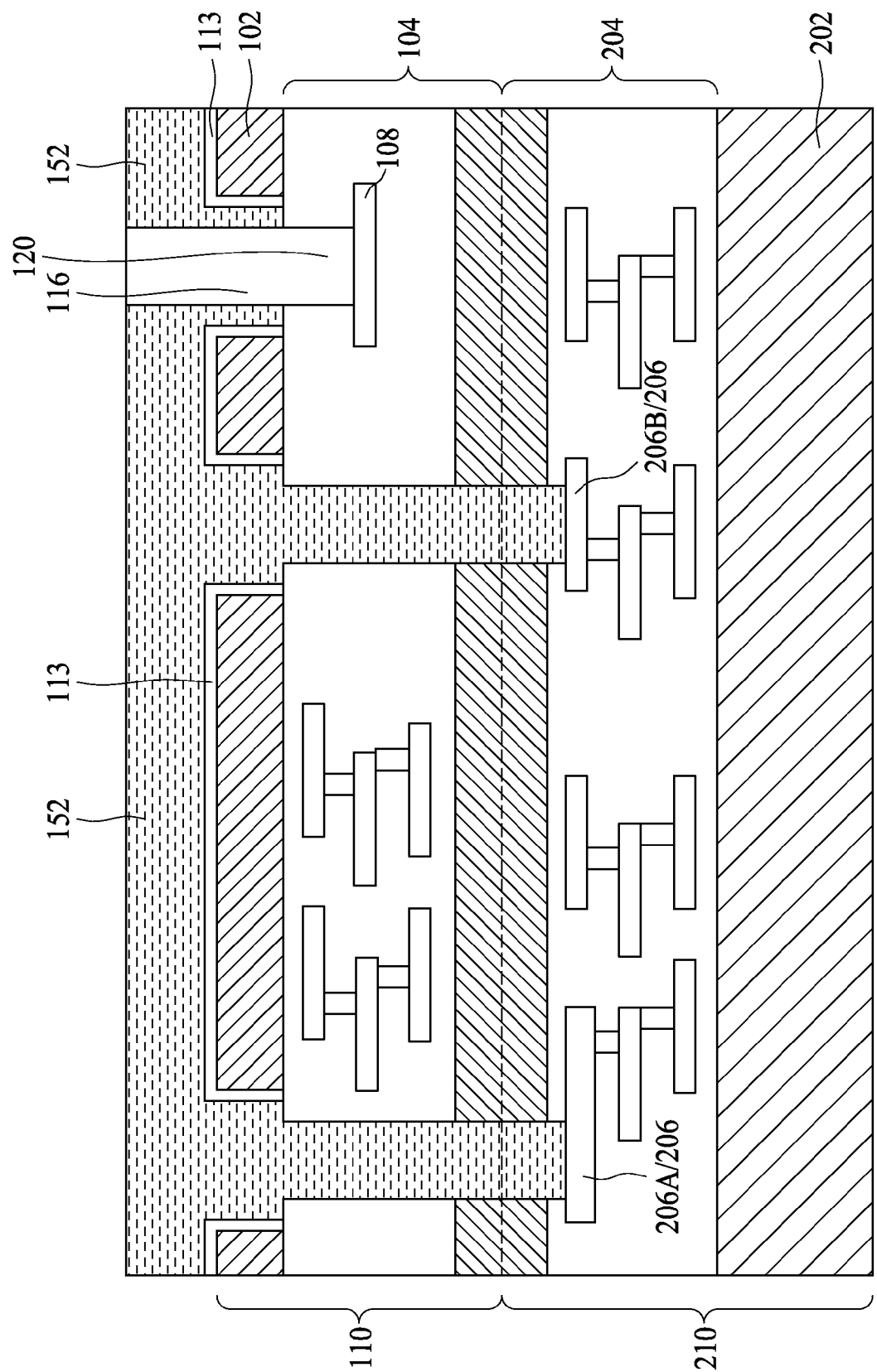

Referring to FIG. 14, mask layer 152, which may be a photo resist, is formed and patterned. Mask layer 152 covers openings 118A and 118B (FIG. 13) and leaves a center portion of opening 116 in substrate 102 exposed. An anisotropic etching is then performed to etch dielectric layers 104 to form opening 120, which stops at metal pad 108. Mask layer 152 is removed after the formation of opening 120.

As shown in FIGS. 13 and 14, in accordance with these embodiments, openings 118A and 118B are formed in a lithography step other than the step for forming opening 120. This is partially because metal pad 108 is much higher than metal pads 206, and hence metal pad 108 cannot be used as an effective etch stop layer if openings 118A, 118B and 120 are formed simultaneously. Otherwise, metal pad 108 may be undesirably etched through.

Figure 15:
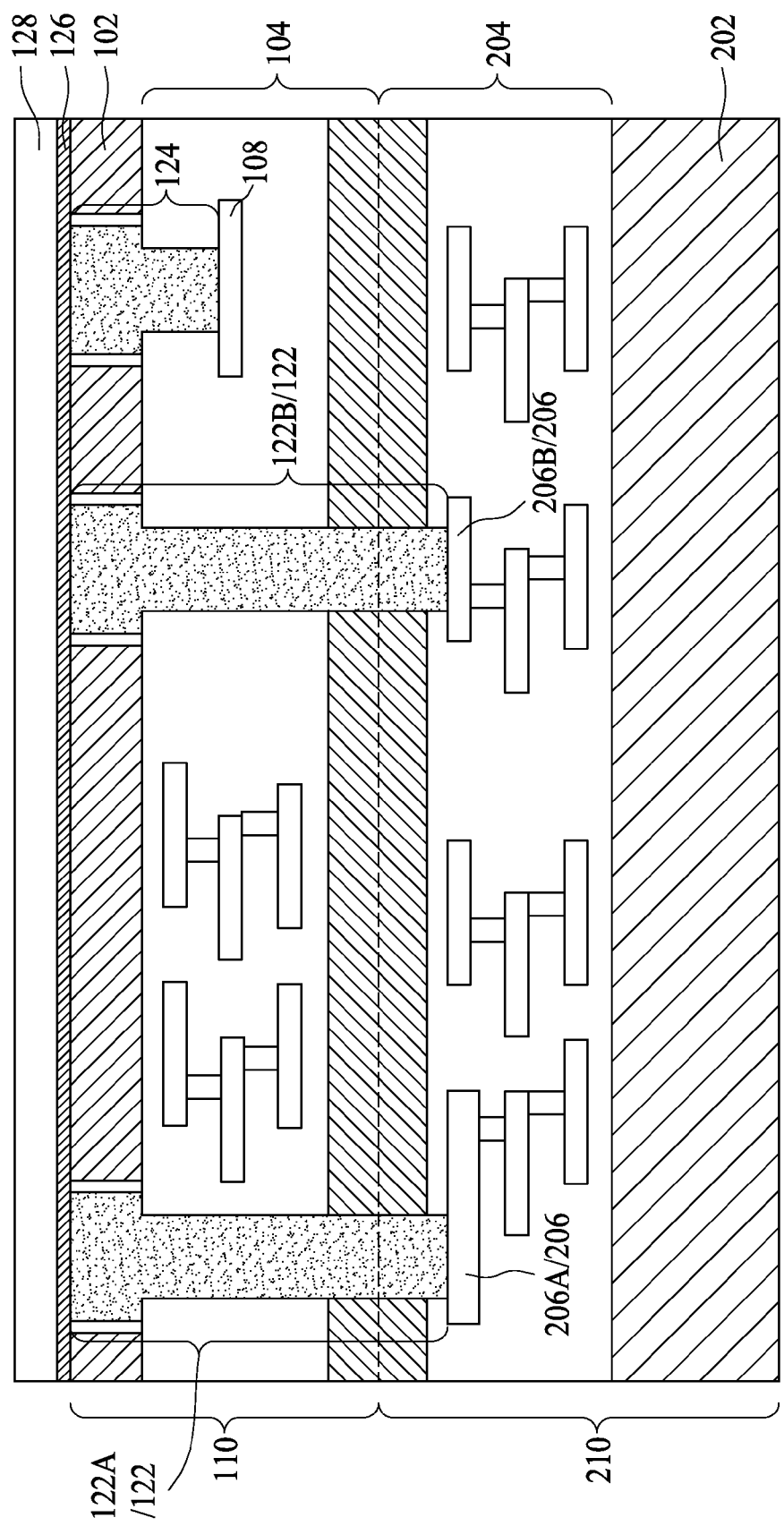
Figure 16:
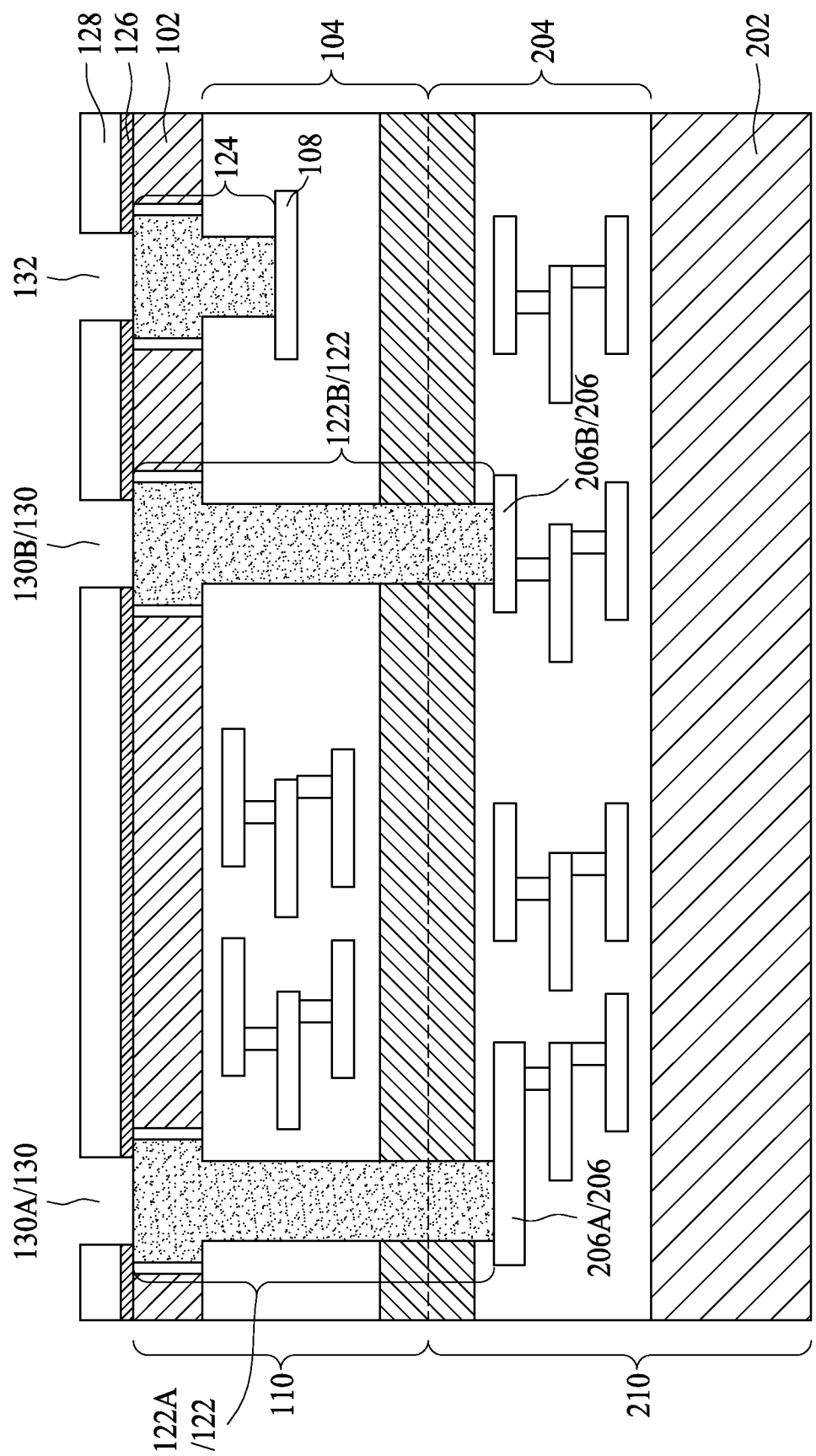
Figure 17:
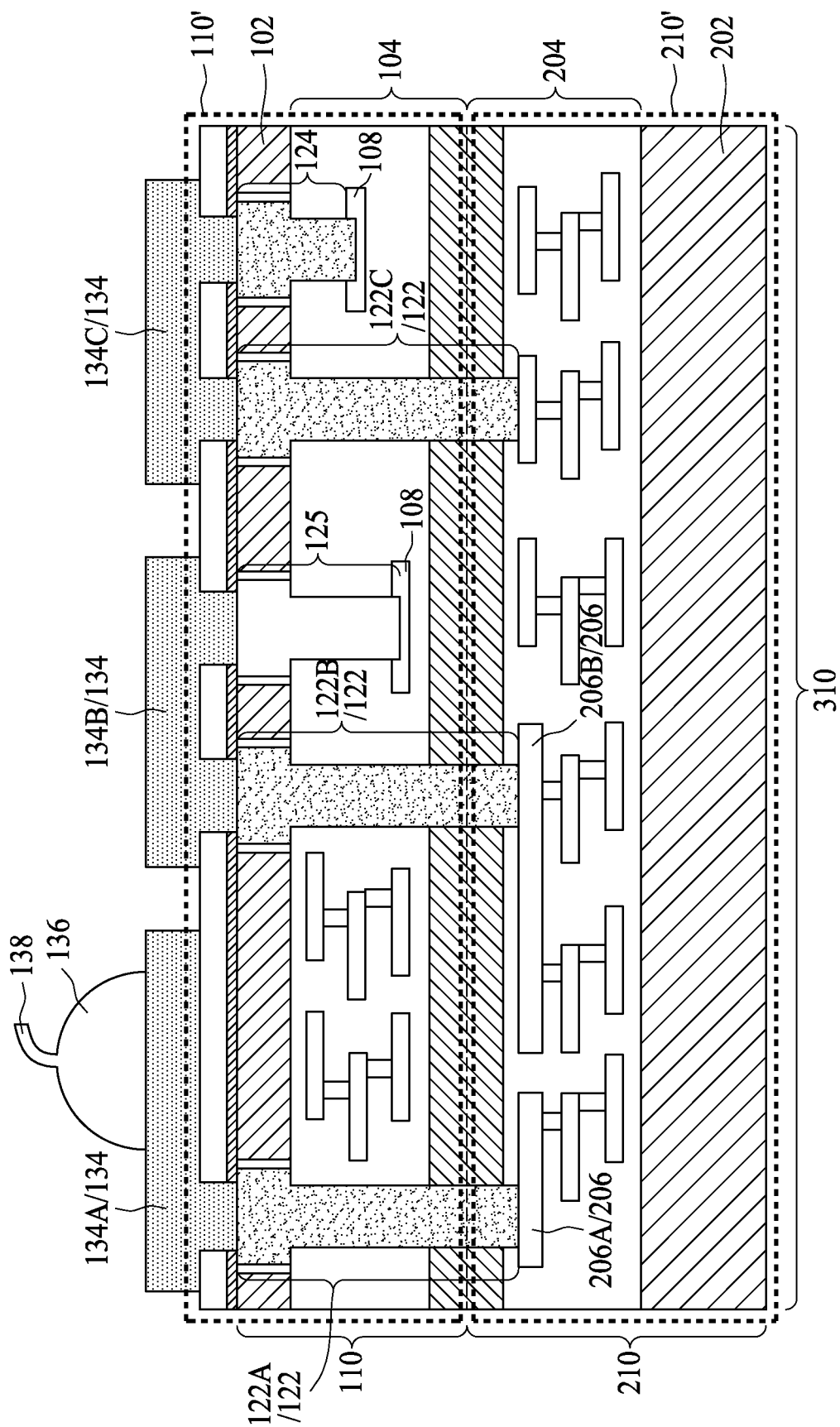

The remaining process steps shown in FIGS. 15 through 17 are essentially the same as in FIGS. 6 and 7. As shown in FIG. 17, conductive plugs 122 (including 122A, 122B, and 122C), 124, 125, RDLs 134 (including 134A, 134B, and 134C), and wire bond 136/138 are formed. FIG. 17 illustrates some additional conductive plugs and vias other than what are illustrated in the steps in FIGS. 10 through 16. The structure and the formation of additional conductive plugs and vias, however, can be realized through the teaching of the present disclosure.

In FIG. 17, each of conductive plugs 122A, 122B, and 122C includes two portions, with the first portion penetrating through substrate 102 and the second portion penetrating through dielectric layers 104 and into dielectric layers 204 and all the way to metal pads 206. Similar to the embodiments in FIGS. 7 and 9, RDLs 134 in accordance with these embodiments can be used to connect to the conductive plugs 122 that interconnect chips 110' and 210'. In addition, RDLs 134 may be used as bond pads.

Figure 18:
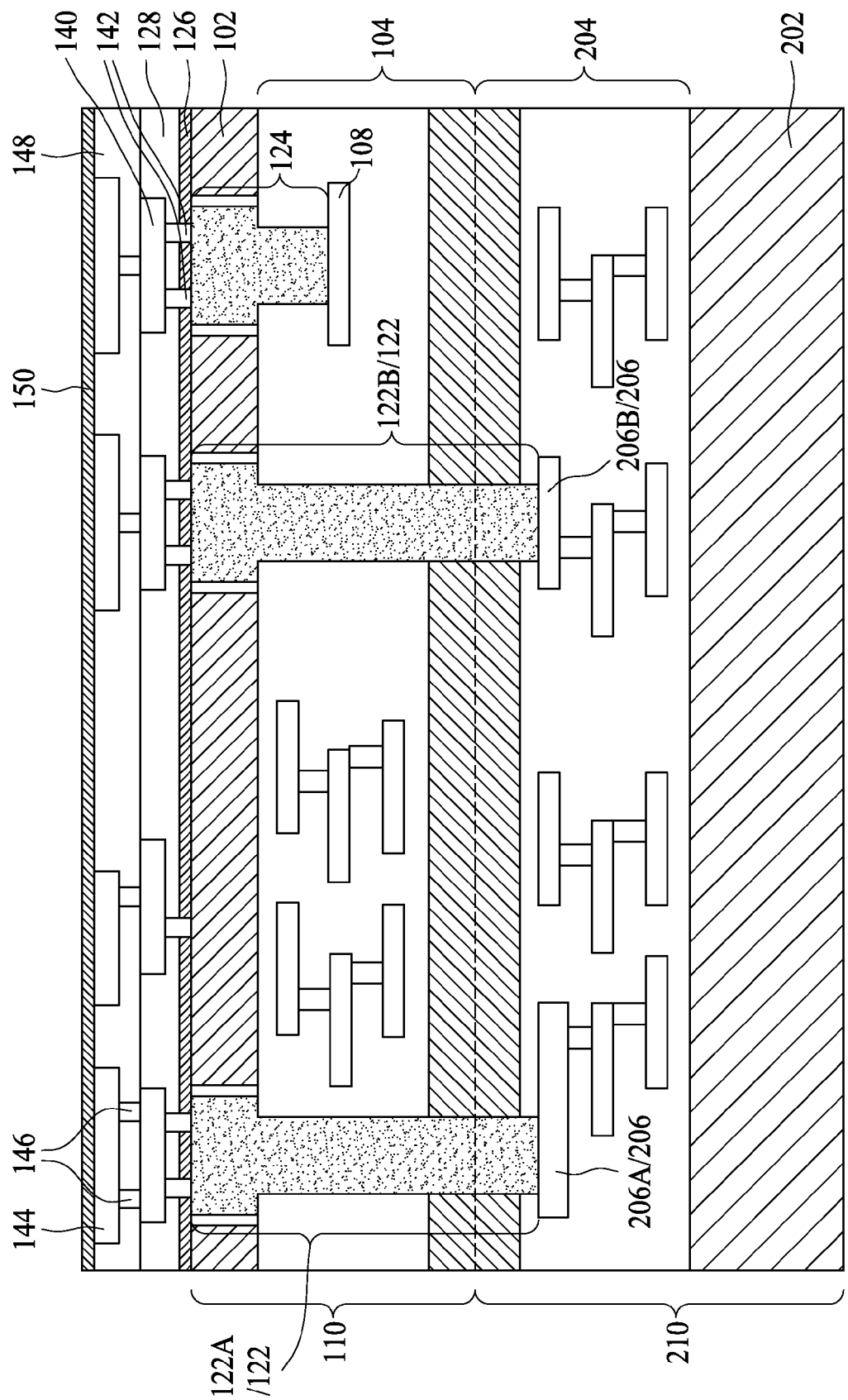
FIGS. 18 and 19 illustrate the cross-sectional views of intermediate stages in the formation of a package including stacked dies and including an interconnect structure connecting two chips in accordance with some other embodiments, wherein a metal hard mask is not used.
Figure 19:
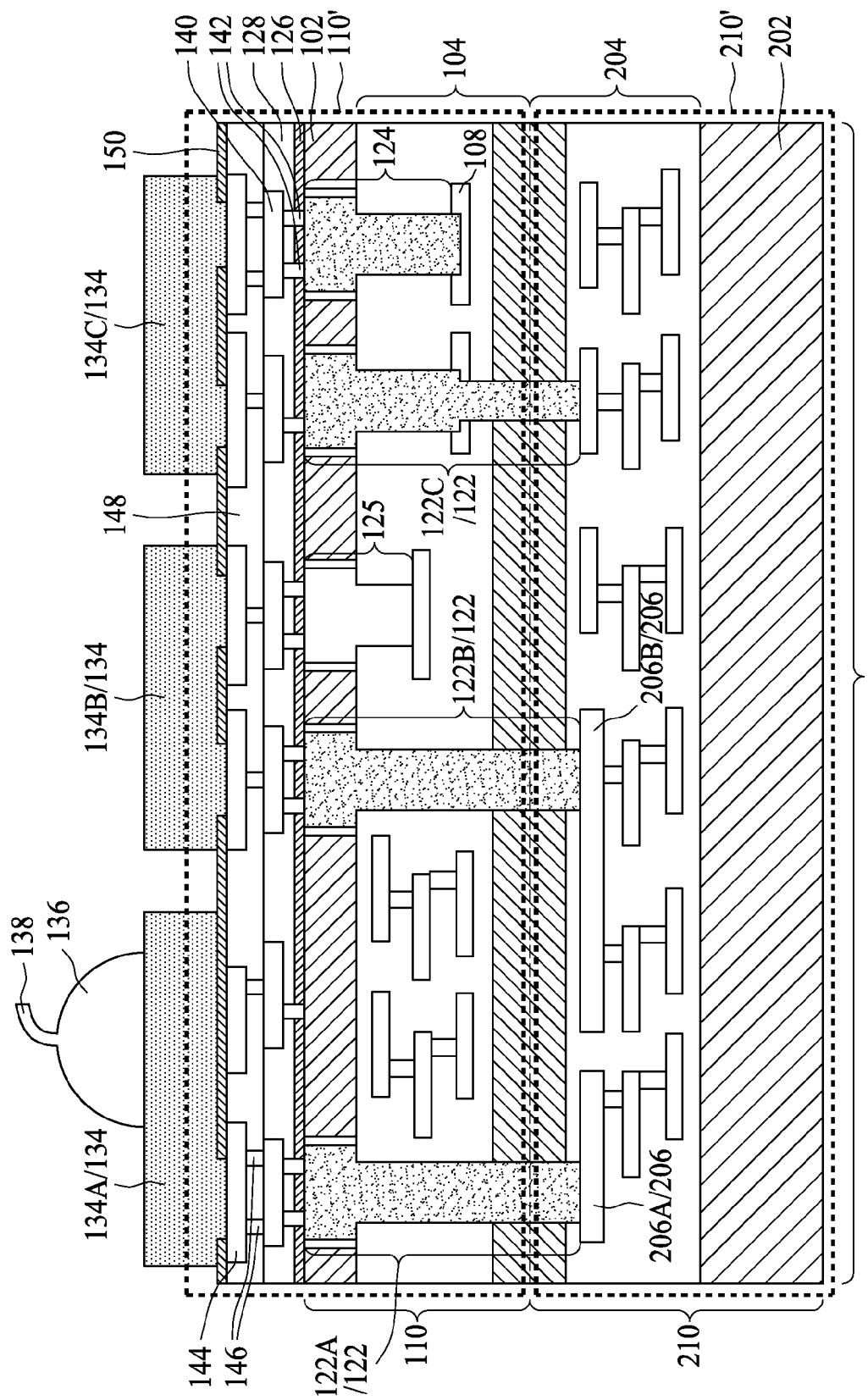

FIGS. 18 and 19 illustrate cross-sectional views of intermediate stages in the formation of stacked chips in accordance with alternative embodiments. These embodiments are similar to the embodiments in FIGS. 10 through 17, except that dual damascene structures including metal lines 140 and 144 and vias 142 and 146 are formed in dielectric layers 128 and 148. The dual damascene structures interconnect RDLs 134 and the underlying conductive plugs 122, 124, and 125 to improve the signal routing ability of package 310. The rest of the features are essentially the same as in FIG. 17 and hence are not discussed herein.

Figure 20B:
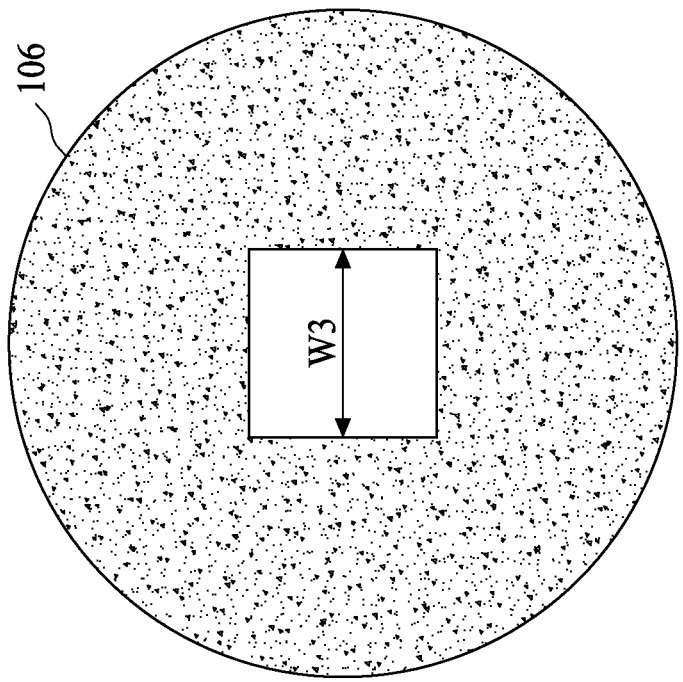
FIGS. 20A through 20D illustrate top views of various metal pads in accordance with various embodiments of the present disclosure, wherein the metal pads are used to form conductive plugs.
Figure 20A:
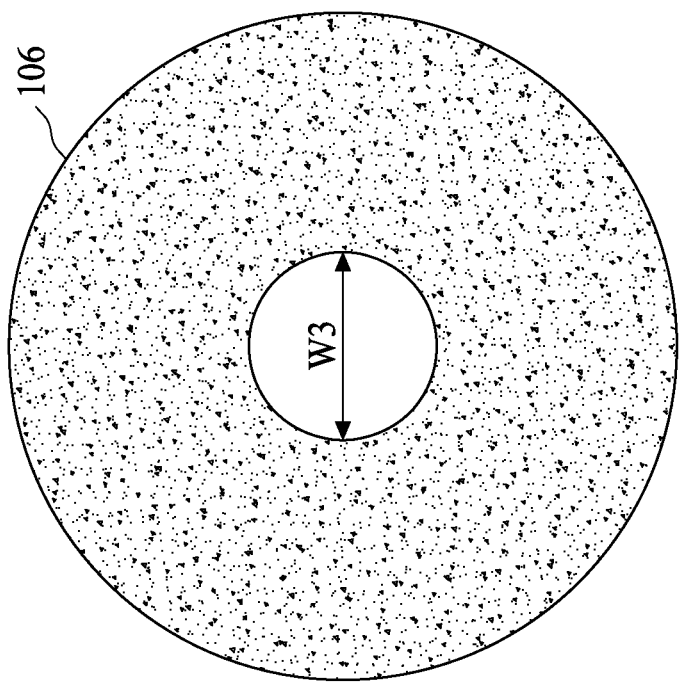
Figure 20D:
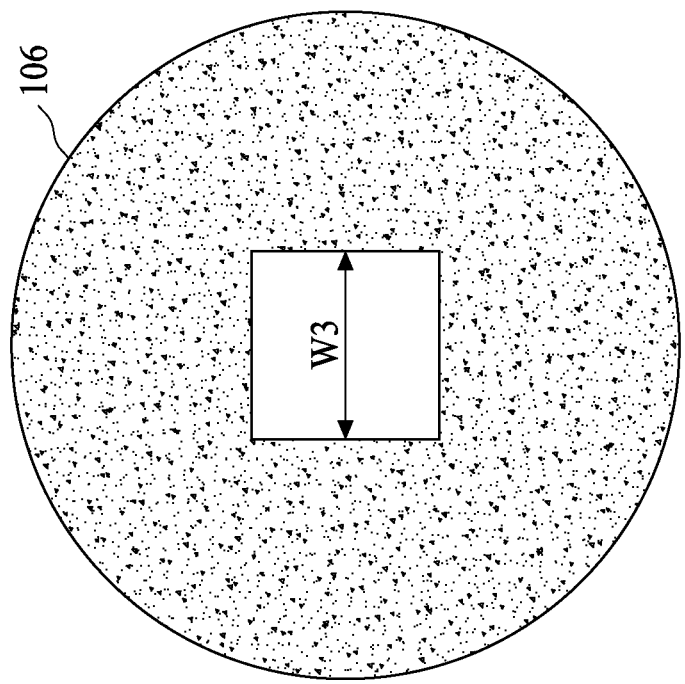
Figure 20C:
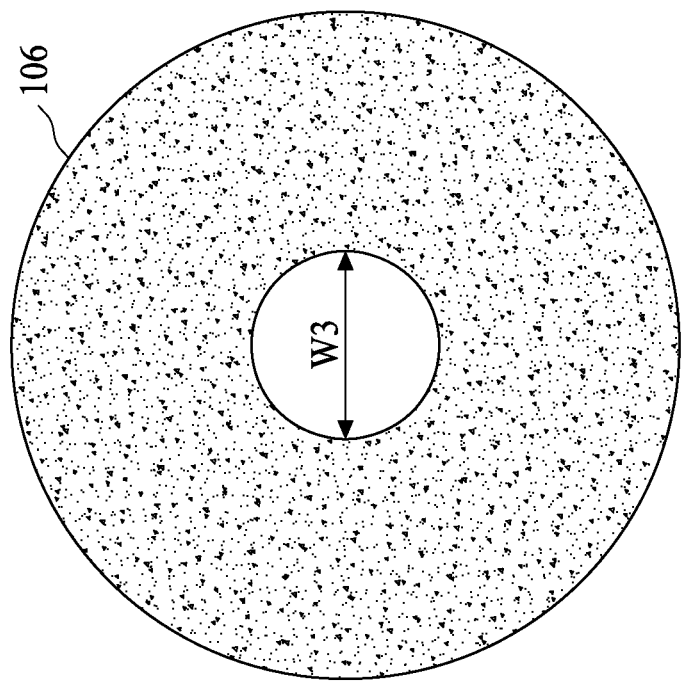

FIGS. 20A through 20D illustrate various top views of metal hard mask (metal pad) 106 in accordance with various embodiments of the present disclosure. FIG. 20A shows metal pad 106 is of a circular shape, with the inner edge and the outer edge both being circles. FIG. 20B illustrates that the outer edge of metal pad 106 has the shape of a circle, while the inner edge of metal pad 106 has the shape of a rectangle (such as a square). FIG. 20C shows metal pad 106 is of a ring shape, with the inner edge and the outer edge both being circles. FIG. 20D illustrates that the outer edge of metal pad 106 has the shape of a circle, while the inner edge of metal pad 106 has the shape of a rectangle (such as a square).

The embodiments of the present disclosure have some advantageous features. The active circuits of both semiconductor chips in a package are connected to each other through continuous conductive plugs (e.g. conductive plugs 122 in FIGS. 7, 9, 17, and 19). Such continuous conductive plugs help reduce the footage of the package. Furthermore, in comparison to the conventional stacked semiconductor devices connected by the conductive plugs that include multiple portions, the continuous conductive plugs coupled between two semiconductor wafers/dies help cut power consumption and prevent parasitic interference. The thinned substrate also results in a reduction of the length and pitch of conductive plugs.

In accordance with some embodiments of the present disclosure, an integrated circuit structure includes a first and a second semiconductor chip. The first semiconductor chip includes a first substrate and a first plurality of dielectric layers underlying the first substrate. The second semiconductor chip includes a second substrate and a second plurality of dielectric layers over the second substrate, wherein the first plurality of dielectric layers is bonded to the second plurality of dielectric layers. A metal pad is in the second plurality of dielectric layers. A redistribution line is over the first substrate. A conductive plug is underlying and electrically coupled to the redistribution line. The conductive plug includes a first portion extending from a top surface of the first substrate to a bottom surface of the first substrate, and a second portion extending from the bottom surface of the first substrate to the metal pad. A bottom surface of the second portion contacts a top surface of the metal pad. The first portion and the second portion form a continuous region.

In accordance with alternative embodiments of the present disclosure, an integrated circuit structure includes a first semiconductor chip and a second semiconductor chip. The first semiconductor chip includes a first substrate, a first plurality of dielectric layers, and a first metal pad in one of the first plurality of dielectric layers. The second semiconductor chip includes a second substrate, and a second plurality of dielectric layers over the second substrate. A bottom layer of the first dielectric layers is bonded to a top layer of the second plurality of dielectric layers. The second semiconductor chip further includes a second metal pad in one of the second plurality of dielectric layers. A conductive plug electrically couples the first metal pad to the second metal pad. The conductive plug includes a first portion extending from a top surface of the first substrate to a top surface of the first metal pad, and a second portion extending from the top surface of the first metal pad to a top surface of the second metal pad. An edge of the second portion is in physical contact with a sidewall of the first metal pad. A redistribution line is over the first substrate, wherein the redistribution line is electrically coupled to the conductive plug.

In accordance with yet alternative embodiments of the present disclosure, a method includes bonding a first chip to a second chip, wherein a first plurality of dielectric layers in the first chip is bonded to a second plurality of dielectric layers in the second chip. A first through-opening is formed in a first substrate of the first chip. The first plurality of dielectric layers and the second plurality of dielectric layers are etched through the first opening to form a second opening. A metal pad in the second plurality of dielectric layers is exposed to the second opening. A conductive material is filled to form a conductive plug in the first opening and the second opening. A dielectric layer is formed over the first substrate. A redistribution line is formed. The redistribution line includes a portion over the dielectric layer. The redistribution line is electrically coupled to the conductive plug through an opening in the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
    a first semiconductor chip comprising:
        a first substrate formed of a semiconductor material;
        a first plurality of dielectric layers underlying the first substrate, wherein a top surface of the first plurality of dielectric layers is in direct contact with the semiconductor material of the first substrate; and
    a second semiconductor chip comprising:
        a second substrate;
        a second plurality of dielectric layers over the second substrate, wherein a bottom layer of the first plurality of dielectric layers is bonded to a top layer of the second plurality of dielectric layers;
        a dielectric layer having a top end coplanar with a top surface of the first substrate, and a bottom end coplanar with a bottom surface of the first substrate; and
        a metal pad in one of the second plurality of dielectric layers;
    a redistribution line over the first substrate;
    a first conductive plug underlying and electrically coupled to the redistribution line, wherein the first conductive plug comprises:
        a first portion extending from the top surface of the semiconductor material of the first substrate to the bottom surface of the semiconductor material of the first substrate, wherein the dielectric layer encircles and is in contact with the first portion; and
        a second portion extending from the bottom surface of the semiconductor material of the first substrate to the metal pad, wherein a bottom surface of the second portion contacts a top surface of the metal pad, and wherein the first portion and the second portion form a continuous region.

2. The integrated circuit structure of claim 1, wherein the first conductive plug comprises a homogenous material extending from the top surface of the first substrate into the second semiconductor chip, with no interface formed in the homogenous material.

3. The integrated circuit structure of claim 1 further comprising a wire bond over and bonded to the redistribution line.

4. The integrated circuit structure of claim 1, wherein the first semiconductor chip further comprises an additional metal pad forming a ring, with an opening in the ring, and wherein the second portion of the first conductive plug further comprises:
    a third portion over the additional metal pad; and
    a fourth portion penetrating through the additional metal pad to extend to the metal pad of the second semiconductor chip.

5. The integrated circuit structure of claim 1 further comprising a dual damascene structure comprising a metal line and a via underlying the metal line, with the via being narrower than the metal line, wherein the dual damascene structure interconnects the redistribution line and the first conductive plug.

6. The integrated circuit structure of claim 1, wherein the first semiconductor chip further comprises:
   an additional metal pad in the first plurality of dielectric layers; and
   a second conductive plug extending from the top surface of the first substrate to the additional metal pad, wherein the second conductive plug stops on a top surface of the additional metal pad, wherein in a cross-sectional view of the integrated circuit structure, an entirety of the second conductive plug is over the top surface of the additional metal pad, and wherein the redistribution line electrically couples the first conductive plug to the second conductive plug.

7. The integrated circuit structure of claim 1, wherein the first semiconductor chip further comprises:
   an additional metal pad in the first plurality of dielectric layers; and
   a second conductive plug extending from the top surface of the first substrate to the additional metal pad, wherein the second conductive plug stops on a top surface of the additional metal pad, with an entirety of the second conductive plug being over the top surface of the additional metal pad, and wherein the additional metal pad physically connects the first conductive plug to the second conductive plug.

8. An integrated circuit structure comprising:
   a first semiconductor chip comprising:
      a first substrate formed of a semiconductor material;
      a first plurality of dielectric layers, wherein a top surface of the first plurality of dielectric layers is in direct contact with the semiconductor material of the first substrate; and
      a first metal pad in one of the first plurality of dielectric layers;
   a second semiconductor chip comprising:
      a second substrate;
      a second plurality of dielectric layers over the second substrate, wherein a bottom layer of the first plurality of dielectric layers is bonded to a top layer of the second plurality of dielectric layers; and
      a second metal pad in one of the second plurality of dielectric layers;
   a first conductive plug electrically coupling the first metal pad to the second metal pad, wherein the first conductive plug comprises:
      a first portion comprising:
         an upper portion extending from a top surface of the semiconductor material of the first substrate to a bottom surface of the semiconductor material of the first substrate; and
         a lower portion underlying and in contact with the first portion, wherein the lower portion extends from the bottom surface of the semiconductor material of the first substrate to a top surface of the first metal pad; and
      a second portion extending from the top surface of the first metal pad to a top surface of the second metal pad, wherein an edge of the second portion is in physical contact with a sidewall of the first metal pad, and the first metal pad encircles and physically contacts the second portion of the first conductive plug; and
   a redistribution line over the first substrate, wherein the redistribution line is electrically coupled to the first conductive plug.

9. The integrated circuit structure of claim 8, wherein the upper portion has a width greater than a width of the lower portion.

10. The integrated circuit structure of claim 8, wherein the first conductive plug continuously extends from the top surface of the first substrate to the top surface of the second metal pad.

11. The integrated circuit structure of claim 8, wherein the first conductive plug comprises:
   a conductive barrier extending from the top surface of the first substrate to the top surface of the second metal pad; and
   a filling metal encircled by the conductive barrier.

12. The integrated circuit structure of claim 8 further comprising a wire bond over and bonded to the redistribution line.

13. The integrated circuit structure of claim 8, wherein the first semiconductor chip further comprises:
   an third metal pad in the first plurality of dielectric layers; and
   a second conductive plug extending from the top surface of the first substrate to the third metal pad, wherein the second conductive plug stops on a top surface of the third metal pad, with an entirety of the second conductive plug being over the top surface of the third metal pad, and wherein the redistribution line electrically couples the first conductive plug to the second conductive plug.

14. The integrated circuit structure of claim 8, wherein the first semiconductor chip further comprises:
   a third metal pad in the first plurality of dielectric layers; and
   a second conductive plug extending from the top surface of the first substrate to the third metal pad, wherein the second conductive plug stops on a top surface of the third metal pad, with an entirety of the second conductive plug being over the top surface of the third metal pad, and wherein the third metal pad physically connects the first conductive plug to the second conductive plug.

15. An integrated circuit structure comprising:
   a first semiconductor chip comprising:
      a semiconductor substrate;
      a first plurality of dielectric layers underlying the semiconductor substrate, wherein a bottom surface of a semiconductor material of the semiconductor substrate is in contact with a top surface of the first plurality of dielectric layers; and
      a first metal pad in one of the first plurality of dielectric layers;
   a second semiconductor chip underlying and bonded to the first semiconductor chip, the second semiconductor chip comprising:
      a second plurality of dielectric layers; and
      a second metal pad in one of the second plurality of dielectric layers;
   a conductive plug comprising:
      a top end coplanar with a top surface of the semiconductor material of the semiconductor substrate; and
      a first bottom surface contacting a top surface of the first metal pad, and a second bottom surface contacting a top surface of the second metal pad; and
   a via contacting a top surface of the conductive plug.

16. The integrated circuit structure of claim 15 further comprising a second semiconductor substrate in the second semiconductor chip, wherein both the first plurality of dielectric layers and the second plurality of dielectric layers are between the first semiconductor chip and the second semiconductor chip.

17. The integrated circuit structure of claim 15 further comprising a wire bond electrically coupled to the via, wherein the wire bond is over the first semiconductor chip.

18. The integrated circuit structure of claim 15, wherein the conductive plug comprises a homogenous material extending from the top surface of the first semiconductor chip into the second semiconductor chip, with no interface formed in the homogenous material.

19. The integrated circuit structure of claim 8 further comprising a dielectric layer in the first substrate, wherein the dielectric layer has a top end coplanar with a top semiconductor surface of the first substrate, and a bottom end coplanar with a bottom semiconductor surface of the first substrate.

20. The integrated circuit structure of claim 15 further comprising a dielectric layer in the semiconductor substrate, wherein the dielectric layer has a top end coplanar with a top surface of the semiconductor substrate, and a bottom end coplanar with a bottom surface of the semiconductor substrate.

* * * * *